(12) United States Patent
Cornelissen et al.

(10) Patent No.: US 11,725,803 B2
(45) Date of Patent: Aug. 15, 2023

(54) COMPACT LASER-BASED LIGHT GENERATING DEVICE

(71) Applicant: SIGNIFY HOLDING B.V., Eindhoven (NL)

(72) Inventors: Hugo Johan Cornelissen, Escharen (NL); Olexandr Valentynovych Vdovin, Maarheeze (NL); Robert Van Asselt, Valkenswaard (NL); Marcellus Jacobus Johannes Van Der Lubbe, Best (NL); Georges Marie Calon, Eindhoven (NL); Rifat Ata Mustafa Hikmet, Eindhoven (NL); Ties Van Bommel, Horst (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 17/799,052

(22) PCT Filed: Feb. 9, 2021

(86) PCT No.: PCT/EP2021/053003
§ 371 (c)(1),
(2) Date: Aug. 11, 2022

(87) PCT Pub. No.: WO2021/160573
PCT Pub. Date: Aug. 19, 2021

(65) Prior Publication Data
US 2023/0064361 A1 Mar. 2, 2023

(30) Foreign Application Priority Data
Feb. 11, 2020 (EP) ..................................... 20156556

(51) Int. Cl.
*F21V 9/35* (2018.01)
*F21V 29/50* (2015.01)
(Continued)

(52) U.S. Cl.
CPC .................. *F21V 9/35* (2018.02); *F21V 7/06* (2013.01); *F21V 29/50* (2015.01); *G02B 26/008* (2013.01)

(58) Field of Classification Search
CPC ... F21V 9/35; F21V 29/50; F21V 7/06; G02B 26/008
See application file for complete search history.

(56) References Cited

U.S. PATENT DOCUMENTS

2013/0194777 A1* 8/2013 Berben ................. F21S 41/176
362/322
2013/0329426 A1* 12/2013 Finsterbusch ........ G03B 21/204
362/235
(Continued)

FOREIGN PATENT DOCUMENTS

EP 2980622 A1 2/2016
JP 2013171623 A 9/2013
(Continued)

*Primary Examiner* — Evan P Dzierzynski
*Assistant Examiner* — Nathaniel J Lee

(57) ABSTRACT

The invention provides an arrangement (1) comprising a device (1000), wherein the device (1000) comprises a luminescent material comprising element (100) and a light transmissive element (200), wherein: (a) the device (1000) has a first device axis (A1); (b) the luminescent material comprising element (100) comprises a luminescent material (110) configured to emit luminescent material light (111) upon irradiation with first light (11), wherein the luminescent material comprising element (100) has a first length (L1) and a characteristic first dimension (D1) perpendicular to the first length (L1), wherein D1/L1<1; wherein the luminescent material comprising element (100) is configured at a non-zero first distance (r1) from the first device axis (A1), and wherein the luminescent material comprising element (100) at least partly surrounds the first device axis (A1); (c) the light transmissive element (200) is transmissive for the first light (11), wherein the light transmissive element (200) comprises a element light entrance part (201 and an element light escape part (202), wherein the element light escape part (202) and the luminescent material (110) are (Continued)

radiationally coupled; wherein one or more of the following applies: (i) the first device axis (A1) intersects the light transmissive element (200), and (ii) the light transmissive element (200) at least partly surrounds the first device axis (A1); and (d) the luminescent material comprising element (100) is in thermal contact with one or more of (a) the light transmissive element (200) and (b) an optional thermally conductive element (300).

15 Claims, 9 Drawing Sheets

(51) Int. Cl.
*F21V 7/06* (2006.01)
*G02B 26/00* (2006.01)

(56) References Cited

U.S. PATENT DOCUMENTS

| | | |
|---|---|---|
| 2015/0380616 A1 | 12/2015 | Chen et al. |
| 2019/0187544 A1 | 6/2019 | Liao et al. |
| 2019/0331991 A1 | 10/2019 | Ikeda et al. |
| 2020/0191342 A1* | 6/2020 | Welna .................. G02B 5/0294 |

FOREIGN PATENT DOCUMENTS

| | | | |
|---|---|---|---|
| JP | 2018128617 A | 8/2018 | |
| WO | 2013008221 A1 | 1/2013 | |
| WO | WO-2013008221 A1 * | 1/2013 | ............... F21K 2/00 |

\* cited by examiner

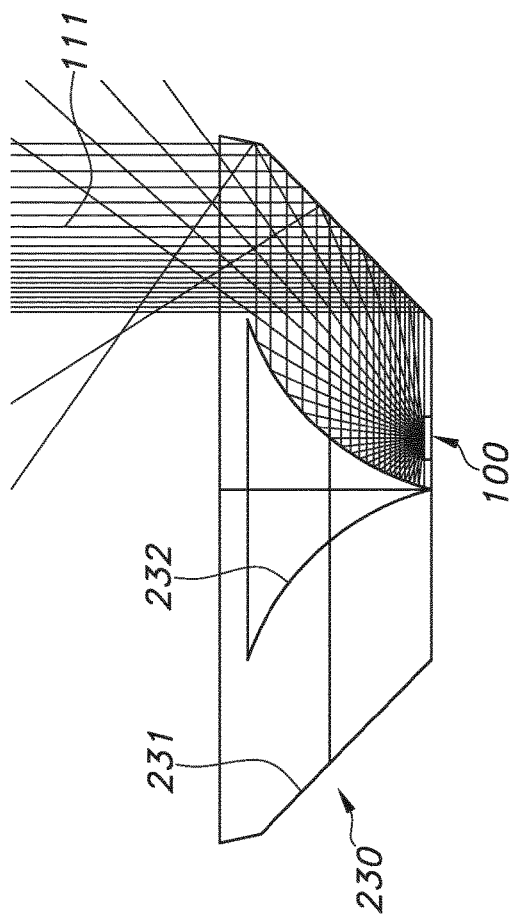
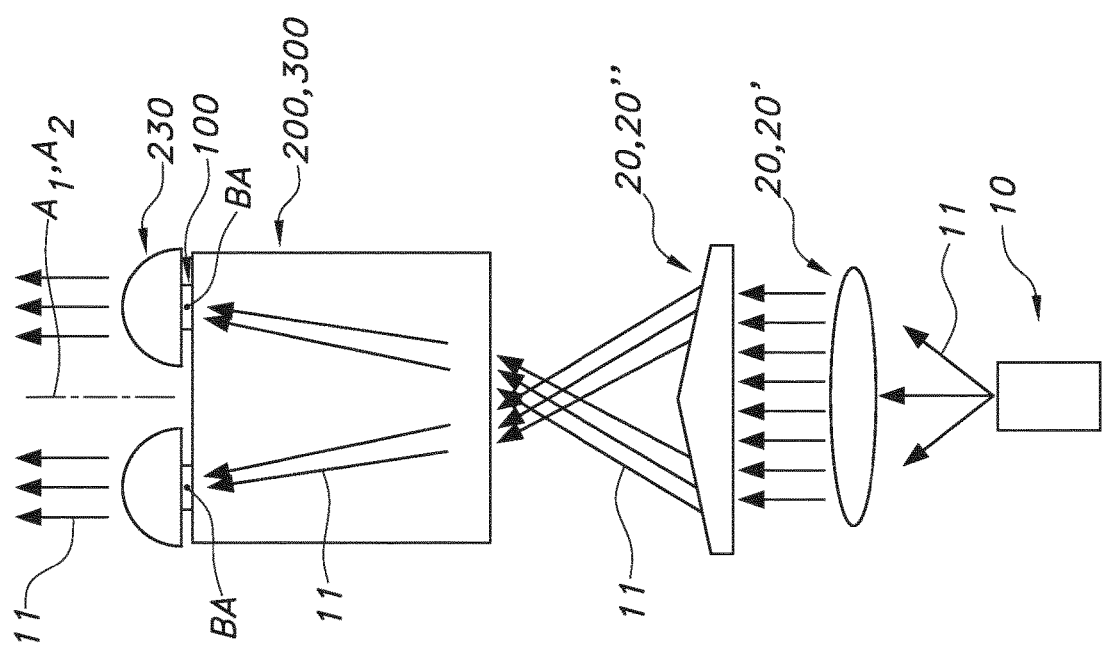
FIG. 4B
FIG. 4A

COMPACT LASER-BASED LIGHT GENERATING DEVICE

CROSS-REFERENCE TO PRIOR APPLICATIONS

This application is the U.S. National Phase application under 35 U.S.C. § 371 of International Application No. PCT/EP2021/053003, filed on Feb. 9, 2021, which claims the benefit of European Patent Application No. 20156556.1, filed on Feb. 11, 2020. These applications are hereby incorporated by reference herein.

FIELD OF THE INVENTION

The invention relates to a (lighting) arrangement comprising a device. The invention also relates to a luminaire or spotlight (or other application) comprising such arrangement.

BACKGROUND OF THE INVENTION

Wavelength conversion elements are known in the art. US2019/0331991, for instance, describes a wavelength conversion element comprising a first phosphor region; and a second phosphor region that is disposed in a thickness direction of the first phosphor region and has a phosphor particle with a particle size different from a particle size of a phosphor particle positioned in the first phosphor region. US2019/0331991 also describes a phosphor wheel comprising such wavelength conversion element; a base plate on which the wavelength conversion element is provided; and a motor that rotationally drives the base plate.

SUMMARY OF THE INVENTION

While white LED sources can give an intensity of e.g. up to about 300 lm/mm$^2$; static phosphor converted laser white sources can give an intensity even up to about 20.000 lm/mm$^2$. Ce doped garnets (e.g. YAG, LuAG) may be the most suitable luminescent convertors which can be used for pumping with blue laser light as the garnet matrix has a very high chemical stability. Further, at low Ce concentrations (e.g. below 0.5%) temperature quenching may only occur above about 200° C. Furthermore, emission from Ce has a very fast decay time so that optical saturation can essentially be avoided. In applications, such as automotive, correlated color temperatures above about 5000 K at low CRI are desirable. However, in other applications e.g. light sources with a high CRI, like e.g. at least 90, and a relatively low CCT, like e.g. at maximum 3000 K, may be desirable. For instance, in some applications an intensity higher than 1 GCd/m$^2$ with CRI≥90 and at lower CCT≤3000 K appear desirable. For a good color rendering and/or R9, addition of a red phosphor may be useful. However, it appears that such phosphors often cannot withstand high pump powers, and or show thermal quenching, and/or show degradation.

Hence, it is an aspect of the invention to provide an alternative solution, which preferably further at least partly obviates one or more of above-described drawbacks. The present invention may have as object to overcome or ameliorate at least one of the disadvantages of the prior art, or to provide a useful alternative.

Hence, in a first aspect the invention provides an arrangement comprising a device, wherein the device comprises a luminescent material comprising element and a light transmissive element. Especially, the device has a first device axis (A1). Further, the luminescent material comprising element comprises a luminescent material configured to emit luminescent material light upon irradiation with first light. In specific embodiments, the luminescent material comprising element has a first length (L1) and a characteristic first dimension (D1) perpendicular to the first length (L1). In even more specific embodiments, D1/L1<1. Further, in embodiments the luminescent material comprising element is configured at a first distance (r1) from the first device axis (A1). Especially, this distance is a non-zero distance. Further, in specific embodiments the luminescent material comprising element may at least partly surround the first device axis (A1). Especially, the light transmissive element is transmissive for the first light. Yet further, in embodiments the light transmissive element comprises an element light entrance part (especially for the first light) and an element light escape part (also especially for the first light). In further specific embodiments, the element light escape part and the luminescent material are radiationally coupled. In specific embodiments, one or more of the following may apply: (i) the first device axis (A1) intersects the light transmissive element, and (ii) the light transmissive element at least partly surrounds the first device axis (A1). Especially, in yet further embodiments the luminescent material comprising element may be in thermal contact with one or more of (a) the light transmissive element and (b) an optional thermally conductive element. Hence, in specific embodiments the invention provides an arrangement comprising a device, wherein the device comprises a luminescent material comprising element and a light transmissive element, wherein: (a) the device has a first device axis (A1); (b) the luminescent material comprising element comprises a luminescent material configured to emit luminescent material light upon irradiation with first light, wherein the luminescent material comprising element has a first length (L1) and a characteristic first dimension (D1) perpendicular to the first length (L1), wherein D1/L1<1; wherein the luminescent material comprising element is configured at a (non-zero) first distance (r1) from the first device axis (A1), and wherein the luminescent material comprising element at least partly surrounds the first device axis (A1); (c) the light transmissive element is transmissive for the first light, wherein the light transmissive element comprises a element light entrance part (for the first light) and an element light escape part (for the first light), wherein the element light escape part and the luminescent material are radiationally coupled; wherein one or more of the following applies: (i) the first device axis (A1) intersects the light transmissive element, and (ii) the light transmissive element at least partly surrounds the first device axis (A1); and (d) the luminescent material comprising element is in thermal contact with one or more of (a) the light transmissive element and (b) an optional thermally conductive element.

With such device, thermal effects may be reduced and/or dissipation of heat may be increased. Further, it may be possible to provide a highly intense light generating device. Further, it may be possible to provide a relatively small light generating device. Hence, a compact light generating device with a higher luminance may be provided. Herein, amongst others in embodiments a compact laser light engine is provided wherein blue laser light may be converted by a (ceramic) phosphor that is mounted as a ring on a spinning transparent rod. In embodiments, the laser light enters the rod through a domed shaped end which focusses the light from the inside of the rod onto the phosphor. The spinning rod can be made from sapphire, providing improved heat management of the phosphor. The present invention provides amongst others alternative phosphor geometries for laser-based light sources which would allow for better lateral heat spreading and lower probability of a hot-spots formation in order to achieve higher source brightness compared to the regular shape top-emitting phosphor of the same area. It also appears that it is possible to manage the light effectively from these alternative source shapes resulting in comparable collimated beam performance.

As indicated above, the arrangement comprises a device. This device may provide light upon irradiation with light source light of a light source, especially a solid state light source, even more especially a laser LED (see further also below). The light source may be part of the arrangement, but is not necessarily comprised by the arrangement in all herein described embodiments. The arrangement in combination with the light source may be configured to generate light. Hence, such arrangement may herein also be indicated as "light generating system" or "lighting system" or "light generating device" or "lighting device". The term "arrangement" is applied, as several different devices may be comprised by the arrangement. In embodiments, one or more elements (such as one or more devices) of the arrangement may be enclosed by a single housing. Further, in embodiments the arrangement may comprise a single device, and a plurality of light sources. Yet further, in embodiments the arrangement may comprise a plurality of devices, and also a plurality of light sources of which one or more are functionally coupled with each of the devices.

The device comprises a luminescent material comprising element and a light transmissive element. Hence, the device may herein also be indicated as "luminescent material comprising device". Further, especially the device has a first device axis (A1). In embodiments, this may be a symmetry axis. In specific embodiments, this may be an axis of rotation for one or more of the luminescent material comprising element and the light transmissive element. Hence, in embodiments the first device axis is an axis of rotation for the light transmissive element. In yet other embodiments, the first device axis is an axis of rotation for the luminescent material comprising element. In yet further specific embodiments, the first device axis is an axis of rotation for the luminescent material comprising element and light transmissive element. The first device axis may be an axis of elongation. The term axis of rotation may especially refer to a $C_n$ axis (or "Ce rotation axis" or "$C_n$ rotational axis"), wherein n is at least 2. As known in the art, a rotation by 360°/n that brings a three-dimensional body into an equivalent configuration comprises a $\hat{C}_n$ symmetry operation. Operations resulting from a $C_n$ symmetry axis comprise a group that is isomorphic to the cyclic group of order n. Would the luminescent material comprising element be provided as a ring-shaped luminescent material comprising element, then the device axis may be configured perpendicular to a plane parallel to the ring-shaped luminescent material comprising element.

In embodiments, the device may have a length or height of at least 200 µm, such as at least 500 µm. Further, in embodiments, the device may have a length or height of at maximum 100 mm, such as at maximum 50 mm, like at maximum about 20 mm. The device may be larger when further optics are available. Especially, embodiments of the device essentially consisting of the luminescent material comprising element and the light transmissive element may have such dimensions, though other dimensions are not excluded.

The luminescent material comprising element comprises a luminescent material configured to emit luminescent material light upon irradiation with first light. Hence, the first light may comprise one or more wavelengths at which the luminescent material may be excited. Especially, in embodiments the luminescent material may be configured to convert at least part of blue light (of a first (laser) light source (see further below)) into (visible) luminescent material light.

Below, some specific embodiments in relation to the luminescent material are described. The luminescent material comprising element may in embodiments essentially consist of the luminescent material, such as e.g. a luminescent ceramic ring-shaped luminescent material comprising element, like a cerium doped garnet ring-shaped luminescent material comprising element. The term "luminescent material comprising element" may also refer to a luminescent material comprising element consisting of (spatially) separate parts, which together form the luminescent material comprising element. For instance, two half circles or four quarter circles may together form a ring-shaped luminescent material comprising element. The invention is not limited to ring-shaped luminescent material comprising elements. Adjacent parts of the luminescent material comprising element may touch each other, or may not be in physical contact and may thus be spatially separated. Such parts may herein also be indicated as "sections".

The luminescent material comprising element may essentially comprise a single luminescent material. However, in other embodiments the luminescent material comprising element may comprise a plurality of different luminescent materials. Such different luminescent materials may have different spectral power distributions of the respective luminescent material light. Alternatively or additionally, such different luminescent materials may especially have different color points (or dominant wavelengths). Colors or color points (or spectral power distributions) of different luminescent material light may differ with at least 0.01 for u' and/or with least 0.01 for v', even more especially at least 0.02 for u' and/or with least 0.02 for v'. In yet more specific embodiments, the respective color points may differ with at least 0.03 for u' and/or with least 0.03 for v'. Here, u' and v' are color coordinate of the light in the CIE 1976 UCS (uniform chromaticity scale) diagram. Hence, in specific embodiments the term "luminescent material comprising element" may also refer to a luminescent material comprising element consisting of (spatially) separate parts, which together form the luminescent material comprising element, and wherein two or more of the of (spatially) separate parts comprise different luminescent materials.

Especially, in embodiments the luminescent material comprising element has a first length (L1) and a characteristic first dimension (D1) perpendicular to the first length (L1). This first dimension may be a thickness or width, a height, or a diameter. Even more especially, D1 may refer to a circular equivalent diameter. The equivalent circular diameter (or ECD) of an (irregularly shaped) two-dimensional shape is the diameter of a circle of equivalent area. For instance, the equivalent circular diameter of a square with side a is $2*a*SQRT(1/\pi)$. Here, the term "cross-sectional shape" refers to the cross-section perpendicular to the first length. Especially, D1/L1<1. Hence, in embodiments the luminescent material comprising element may have an aspect ratio larger than 1, as the length may be larger than the characteristic dimension. In specific embodiments D1/L1≤5, even more especially D1/L1≤10. In yet further specific embodiments D1/L1≤20. In general, D1/L1≥0.001, though other values may also be possible. Would the luminescent material comprising element comprise a plurality of parts, the accumulated length of the individual parts may provide the first length. For instance, in case of a ring-like shape, the ring may have first length (see also below) which is essentially the same as circular length (i.e. $2*\pi*r$, wherein r may e.g. be an average radius (between a largest radius and a smallest radius of the ring). The characteristic first dimension may be a circular equivalent diameter of the cross-section of the ring-like shape perpendicular to the first length. Especially, the cross-section may be configured parallel to the first device axis.

This ratio D1/L1<1 allows a relatively large thermal contact with an element that can transfer heat. For instance, to this end the light transmissive element or a an(other) thermally conductive element may be applied. This ratio D1/L1<1 may also be relevant in relation to embodiments wherein focused light is applied, as the luminescent material comprising element may be relatively thin. For instance, the length may in embodiments be selected from the range of about 0.5-200 mm, such as about 3-30 mm. In embodiments, the characteristic first dimension may be at least 0.5 mm, such as at least 1 mm. Hence, in further specific embodiments the length may in embodiments be at least 1 mm, such as especially at least 2 mm, such as especially at least about 3 mm.

In embodiments, at least 25%, such as at least about 50%, like in embodiments 50-75% of the external surface of the luminescent material comprising element may be in thermal contact with one or more of (a) the light transmissive element and (b) the optional thermally conductive element.

In specific embodiments, the luminescent material comprising element is configured at a first distance (r1) from the first device axis (A1). Especially, this refers to a non-zero distance. Hence, in further specific embodiments the luminescent material comprising element is configured at a non-zero first distance (r1) from the first device axis (A1). This non-zero distance may be selected from the range of at least about 50 µm, like at least about 100 µm. This non-zero distance may be selected from the range of at least about −0.2 mm. In other embodiments, the non-zero distance may be at maximum about 20 mm, such as at maximum about 10 mm, more especially at maximum about 1 mm, such as in specific embodiments even at maximum 0.5 mm. Especially, the non-zero first distance may be selected from the range of 0.1-20 mm. However, other values may also be possible.

Especially, in embodiments the luminescent material comprising element at least partly surrounds the first device axis (A1). For instance, in embodiments the luminescent material comprising element may surround the first device axis (A1) and has a shape selected from. Hence, in specific embodiments the luminescent material comprising element may surround the first device axis (A1) and has a shape selected from circular, hexagonal, octagonal, and decagonal. As indicated above, the luminescent material comprising element surrounding the first device axis (A1) may in embodiments consist of a single element, such as in embodiments a ring-shaped element. In yet other embodiments, the luminescent material comprising element surrounding the first device axis (A1) may in embodiments consist of two or more parts (see also above), of which two or more may touch each other, or may not be in physical contact and may thus be spatially separated. In specific embodiments, the luminescent material comprising element has a ring-like shape. Especially, in such embodiments the first length (L1) may be a circular length (Lc). Further, especially in such embodiments the characteristic first dimension (D1) may be a height (H1) or width (W1) of the luminescent material comprising element, or especially a circular equivalent diameter. Further, in such embodiments especially D1/L1≤10. As the luminescent material comprising element may have a non-zero height and non-zero width, the circular length luminescent material comprising element may be a length defined by a body axis of the luminescent material comprising element. Such body axis may be configured at a length averaged distance to the external surface(s) of the luminescent material comprising element. For instance, any cross-section to the luminescent material comprising element may have a middle point. When connecting the middle points, the body axis BA may be obtained.

Further, the devices comprises the light transmissive element. The light transmissive element is especially transmissive for the first light. For instance, the light transmissive element may comprise a ceramic body, like a garnet type of material. In alterative embodiments, the light transmissive element may comprise an alumina material, such as an $Al_2O_3$ based material. In embodiments, the light transmissive element may comprise e.g. sapphire. Other materials may also be possible like one or more of $CaF_2$, MgO, $BaF_2$, $A_3B_5O_{12}$ garnet, ALON (aluminum oxynitride), $MgAl_2O_4$ and $MgF_2$.

The light transmissive element may be used for guiding the first light to the luminescent material and/or for focusing the light in or on the luminescent material comprising element. Further, the light transmissive element may be used to guide away heat from the luminescent material comprising element. In this way the luminescent material comprising element, more especially the luminescent material, may be at a lower temperature when being irradiated with the first light, which may improve efficiency and/or lifetime. Hence, the light transmissive element may have the function of light guide and optionally also the function of optical element, especially focusing. Yet further, the light transmissive element may also have heat guiding properties, by which heat may be guided away from the luminescent material comprising element.

Especially, the light transmissive element comprises an element light entrance part (for the first light) and an element light escape part (for the first light). Hence, first light may enter the light transmissive element via the element light entrance part, propagate through the light transmissive element, and escape therefrom at the element light escape part. Subsequently, it may irradiate at least part of the luminescent material comprising element. Hence, especially the element light escape part and the luminescent material may be radiationally coupled. The element light entrance part and the element light escape part may be parts of the surface(s) of the light transmissive element. The light transmissive element is especially a body of light transmissive material, between the element light entrance part and an element light escape part light transmissive material may be configured.

The terms "radiationally coupled" or "optically coupled", and similar terms, may especially mean that (i) a light generating element, such as a light source, and (ii) another item or material, are associated with each other so that at least part of the radiation emitted by the light transmissive body is received by the item or material. In other words, the item or material is configured in a light-receiving relationship with the light transmissive body. At least part of the radiation of light transmissive body will be received by the item or material. This may in embodiments be directly, such as the item or material in physical contact with the (light emitting surface of the) light transmissive body. This may in embodiments be via a medium, like air, a gas, or a liquid or solid light guiding material. In embodiments, also one or more optics, like a lens, a reflector, an optical filter, may be configured in the optical path between light transmissive body and item or material.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light. The terms "visible", "visible light" or "visible emission" and similar terms refer to light having one or more wavelengths in the range of about 380-780 nm.

As indicated above, especially the light transmissive element may be used for guiding the first light to the luminescent material and/or for focusing the light in or on the luminescent material comprising element. Hence, it appears useful when one or more of the following applies: (i) the first device axis (A1) intersects the light transmissive element, and (ii) the light transmissive element at least partly surrounds the first device axis (A1). Some embodiments in relation to these two options are described below.

For instance, in embodiments a lens shaped light transmissive element may be configured upstream of at least part of the light transmissive element. In embodiments of such light transmissive element, the light transmissive element may have a transmissive element axis (A2). In specific embodiments, the light transmissive element and the first device axis (A1) may coincide (or may in embodiments at least be configured parallel). In such embodiments, the first device axis (A1) intersects the light transmissive element. Further, in such embodiments, the light transmissive element may e.g. be configured as lens, to focus the first light in or on the luminescent material comprising element. Embodiments of the light transmissive element, such as lenses, may in embodiments not only have that the first device axis (A1) intersects the light transmissive element but may in embodiments also comply with the embodiment that the light transmissive element at least partly surrounds the first device axis (A1). Further, as the luminescent material comprising element may have a specific symmetry (relative to the first device axis), the light transmissive element may in embodiments essentially have the same (or a related) symmetry.

In an embodiment, the luminescent material comprising element is mounted on a sapphire rod. As a result, the cooling of the luminescent material comprising element is improved.

The light transmissive element comprises a dome-shaped body having a curved surface, wherein at least part of the curved surface comprises the element light entrance part, wherein the light transmissive element has a transmissive element axis (A2), wherein the first device axis (A1) and the transmissive element axis (A2) coincide. Especially, in embodiments the dome-shaped body is configured to focus the first light on or in the luminescent material comprising element. Hence, the dome-shaped body, a first light source, and the luminescent material comprising element, may be chosen and configured such, that the first light of the first light source, is focused in or on the luminescent material comprising element.

In specific embodiments, the light transmissive element may be configured in thermal contact with the luminescent material comprising element.

In embodiments, the light transmissive element may have a rod shape (or conical shape). The rod-shaped (or conical-shaped) light transmissive element may have a circular cross-section. Further, embodiments of such light transmissive element may have a first face and a second face. The first face and the second face of the light transmissive element may essentially define the length or height of the light transmissive element. In between the first face and the second face, the rod-shaped (or conical-shaped) light transmissive element has an external side face. In embodiments, the first face may comprise the element light entrance part. The second face and/or the externa side face may comprise the element light escape part. First light may especially be provided in such a way, that at least part of the first light propagates in a direction from the first face toe one or more of the second face and/or the externa side face. The luminescent material comprising element may radiationally be coupled with one or more of the second face and/or the external side face. For instance, the luminescent material comprising element may be configured as element enclosing at least part of the external side face. Alternatively (or additionally), luminescent material comprising element may be configured as element on the second face. In both embodiments, the first device axis (A1) may intersect the light transmissive element and the light transmissive element may at least partly surrounds the first device axis (A1). Hence, in specific embodiments the luminescent material comprising element may at least partly surround the light transmissive element, wherein especially the luminescent material comprising element comprises an element entrance part and an element escape part, wherein the element entrance part and element light escape part are radiationally coupled, and wherein the element entrance part is configured closer to the first device axis (A1) than the element escape part.

As indicated above, in embodiments the luminescent material comprising element may be configured at a non-zero distance from the first device axis (A1). Likewise, this may in embodiments apply to the light transmissive element. For instance, in embodiments the light transmissive element may have a similar symmetry (relative to the first device axis) as the luminescent material comprising element. Hence, in embodiments the light transmissive element may (also) at least partly surrounds the first device axis (A1).

In embodiments, the luminescent material comprising element protrudes relative to the light transmissive element. This may (further) facilitate extraction of the luminescent material light. For instance, the light transmissive element may have a first external diameter (relative to the first device axis). The luminescent material comprising element may have a second external diameter (relative to the first device axis), such as the larger diameter of a ring. Further, the luminescent material comprising element may have a third smallest diameter (relative to the first device axis) or internal diameter, such as the smaller diameter from a ring). The third diameter may especially in embodiments be equal to the first distance (r1). The third diameter may in embodiments be smaller than the first external diameter, but the latter may be smaller than the second external diameter. For instance, the ring may have a (slightly) larger diameter than the dome, for instance in embodiments 1-20% larger than the dome diameter.

In order to transfer heat away from the luminescent material comprising element, it is especially useful when the luminescent material comprising element is configured in thermal contact with an element that has a sufficient, especially higher, thermal conductivity. In embodiments, the luminescent material comprising element may be in thermal contact with the light transmissive element. The thermal conductivity of the light transmissive element may in embodiments be moderate to good. For instance, in embodiments the thermal conductivity may be at least 10 W/m/K, such as especially at least 12 W/m/K. Further, as especially metals may have a substantially higher thermal conductivity, such light transmissive element may be in thermal contact with (also) a thermally conductive material (having a higher thermal conductivity than the light transmissive element). Alternatively or additionally, the luminescent material comprising element may be in thermal conductive with (also) a thermally conductive material, such as a metal. The ratio of D1/L1 allows a relatively large contact surface with a thermally conductive material, such as one or more of (a) the light transmissive element and (b) an optional thermally conductive element. Hence, in embodiments the luminescent material comprising element may be configured in thermal contact with one or more of (a) the light transmissive element and (b) an optional thermally conductive element. The thermally conductive material (especially not being the light transmissive element) may be comprised by or may be thermally coupled to a heat sink. An example of a thermally conductive element is a heat sink (or a heat spreader).

A thermally conductive material may especially have a thermal conductivity of at least about 10 W/m/K, such as especially at least about 20 W/m/K, like at least about 30 W/m/K, such as at least about 100 W/m/K, like especially at least about 200 W/m/K. Heatsinks are known in the art. The term "heatsink" (or heat sink) may especially be a passive heat exchanger that transfers the heat generated by device, such as an electronic device or a mechanical device, to a fluid (cooling) medium, often air or a liquid coolant. Thereby, the heat is (at least partially) dissipated away from the device. A heat sink is especially designed to maximize its surface area in contact with the fluid cooling medium surrounding it. Hence, especially a heatsink may comprise a plurality of fins. For instance, the heatsink may be a body with a plurality of fins extending thereof. A heatsink especially comprises (more especially consists of) a thermally conductive material. In embodiments, a heatsink may comprise or consist of one or more of copper, aluminum, silver, gold, silicon carbide, aluminum nitride, boron nitride, aluminum silicon carbide, beryllium oxide, a silicon carbide composite, aluminum silicon carbide, a copper tungsten alloy, a copper molybdenum carbide, carbon, diamond, and graphite. Alternatively, or additionally, the heatsink may comprise or consist of aluminum oxide. The term "heatsink" may also refer to a plurality of (different) heatsinks. An element may be considered in thermal contact with another element if it can exchange energy through the process of heat. In embodiments, thermal contact can be achieved by physical contact. In embodiments, thermal contact may be achieved via a thermally conductive material, such as a thermally conductive glue (or thermally conductive adhesive). Thermal contact may also be achieved between two elements when the two elements are arranged relative to each other at a distance of equal to or less than about 10 µm, though larger distances, such as up to 100 µm may be possible. The shorter the distance, the better the thermal contact. Especially, the distance is 10 µm or less, such as 5 µm or less. The distance may be the distanced between two respective surfaces of the respective elements. The distance may be an average distance. For instance, the two elements may be in physical contact at one or more, such as a plurality of positions, but at one or more, especially a plurality of other positions, the elements are not in physical contact. For instance, this may be the case when one or both elements have a rough surface. Hence, in embodiments in average the distance between the two elements may be 10 µm or less (though larger average distances may be possible, such as up to 100 µm). In embodiments, the two surfaces of the two elements may be kept at a distance with one or more distance holders.

Hence, in embodiments the light transmissive element has a thermal conductivity of at least 10 W/m/K, and the device may further comprise the thermally conductive element, wherein the thermally conductive element is in thermal contact with the light transmissive element.

Especially, the device comprises the luminescent material comprising element and the light transmissive element. These may be integrated in a single device. Hence, in embodiments luminescent material comprising element and the light transmissive element may be (directly) mechanically coupled. Further, the device may comprise a thermally conductive element. Hence, in embodiments the luminescent material comprising element and the light transmissive element may optionally be (directly) mechanically coupled, but at least one of the luminescent material comprising element and the light transmissive element may be (directly) mechanically coupled. Therefore, in embodiments the luminescent material comprising element is mechanically coupled to the light transmissive element and/or (b) the optional thermally conductive element. For instance, the arrangement may comprise such device and a light source, with the latter being radiatively coupled with the former, but in embodiments not in direct contact with each other. See further also below. In specific embodiments, the device may be essentially rotation symmetric about the device axis. Hence, in embodiments the device axis may have a $C_n$ symmetry, with n being at least 2.

As indicated above, in embodiments the luminescent material comprising element comprises a ceramic body comprising the luminescent material. This may provide a relatively stable and thermally stable solution. Hence, the luminescent material may be provided as ceramic body. Further, in embodiments two or more ceramic bodies may be applied, which may comprise the same luminescent material or which may comprise different luminescent materials. In alternative embodiments, the luminescent material comprising element comprises a polymeric body comprising the luminescent material distributed in the polymeric body, wherein the polymeric body comprises a polymeric material, such as in embodiments comprising silicone. However, alternative polymers may also be possible, like acrylates, etc., or silicates (like water glass), etc. Such solutions may provide relatively easily shapeable and producible solutions. As indicated above, in specific embodiments the luminescent material comprising element is ring-shaped.

In embodiments, the arrangement may comprise a light source, herein also indicated as first light source. The first light source configured to generate the first light. Especially, the first light source comprises a laser light source. Hence, in embodiments the arrangement may further comprise a first light source configured to generate the first light, wherein the first light source comprises a laser light source. The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module. The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering). The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation. Especially, in embodiments the term "laser" may refer to a solid-state laser. Hence, in embodiments the light source comprises a laser light source. In embodiments, the terms "laser" or "solid state laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride ($Sm:CaF_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate $Nd:YCa_4O(BO_3)_3$ or Nd:YCOB, neodymium doped yttrium orthovanadate ($Nd:YVO_4$) laser, neodymium glass (Nd:glass) laser, neodymium YLF (Nd:YLF) solid-state laser, promethium 147 doped phosphate glass ($147Pm^{3+}$:glass) solid-state laser, ruby laser ($Al_2O_3$:$Cr^{3+}$), thulium YAG (Tm:YAG) laser, titanium sapphire (Ti:sapphire; $Al_2O_3$:$Ti^{3+}$) laser, trivalent uranium doped calcium fluoride ($U:CaF_2$) solid-state laser, Ytterbium doped glass laser (rod, plate/chip, and fiber), Ytterbium YAG (Yb:YAG) laser, $Yb_2O_3$ (glass or ceramics) laser, etc. In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light. The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape,) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of (laser) light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region (at the side face) is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of (laser) light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above). In embodiments, the optics to collimate are provided by the light transmissive element, such as a dome shaped light transmissive element. Alternatively or additionally, further optics may be applied to collimate.

Herein, the first light source may especially comprise a laser light source (or a plurality of laser light sources, especially of the same bin, and/or a plurality of light sources of different bins. Would different light sources be used, these may excite with (different) first light the luminescent material. However, would different light sources be used, these may in other embodiments excite with different first light different luminescent materials. See further also below in relation to the luminescent material. The term "different first light" may especially refer to different spectral power distributions.

Further, the laser light source especially comprises a laser LED. Optics to focus the light source light of the laser LED may especially be comprised by the device, such as e.g. the dome shaped light transmissive element (see also above).

Hence, in embodiments the luminescent material comprising element is irradiated with the first (laser) light via the light transmissive element. More especially, in embodiments the encloses at least part of the light transmissive element, and is pumped from the inside. It surprisingly appears that this is beneficial for keeping the temperature of the luminescent material comprising element lower or relatively low. When pumping from the outside, the temperature increase may be higher than when pumping from the inside.

In embodiments, the optics may be shaped such to irradiate the luminescent material comprising element over at least part of its length. For instance, over a length of at least 25%, like at least 50%, the luminescent material comprising element may be irradiated with (focused) first light (especially from one laser, or a plurality of lasers). Hence, the optics may not only be used to focus, but also to distribute the first light over at least part of the luminescent material comprising element.

However, in alterative embodiments, only a small part of the luminescent material comprising element may be irradiated during part of the operation time. Even, in such embodiments integrated over time essentially over the entire length the luminescent material comprising element may be irradiated.

In yet further embodiments, the luminescent material comprising element may rotate during operation. This may allow a smaller heating of the luminescent material. Color wheel type of applications are known in the art (see also above). Hence, in specific embodiments the arrangement further comprises an actuator configured to rotate the luminescent material comprising element about the first device axis (A1), and wherein during an operational mode of the arrangement the luminescent material comprising element rotates about the first device axis (A1). Yet further, as can also be derived from the above, especially the first light source may be configured stationary relative to the rotating luminescent material comprising element. Therefore, in embodiments the arrangement may comprise a motor that rotationally drives the luminescent material comprising element about the first device axis (A1). Hence, in embodiments during operation the luminescent material comprising element and the light transmissive element may rotate about the first device axis (A1), as they may be mechanically coupled. Hence, in embodiments the luminescent material comprising element and the light transmissive element are rotatable about the first device axis (A1), and luminescent material comprising element and the light transmissive element may be mechanically coupled. In further embodiments, during operation the luminescent material comprising element, the light transmissive element, and the thermally conductive element may rotate about the first device axis (A1) (as they may be mechanically coupled; see for more detail e.g. above).

Lenses and/or reflective elements may be used to redirect first light (or luminescent material light. For instance, when a rod-shaped light transmissive element is applied, it may be desirable to distribute the first light over at least part of the luminescent material comprising element. Therefore, in specific embodiments the light transmissive element comprises a first reflective element configured to redirect first light from the first light source, such as a laser light source, to the luminescent material comprising element and/or to redirect luminescent material light. Especially, in an operational mode of the arrangement the first light source is configured stationary relative to the luminescent material comprising element. In specific embodiments, the first reflective element may especially be configured to distribute the first light over the luminescent material comprising element, wherein in yet further specific embodiments the luminescent material comprising element has a ring-shaped structure.

In specific embodiments the first luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. Especially, A may comprise one or more of Y, Gd and Lu, such as especially one or more of Y and Lu. Especially, B may comprise one or more of Al and Ga, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In embodiments, the first luminescent material (thus) comprises $A_3B_5O_{12}$ wherein in specific embodiments at maximum 10% of B—O may be replaced by Si—N.

In specific embodiments the luminescent material comprises $(Y_{x1-x2-x3}A'_{x2}Ce_{x3})_3(Al_{y1-y2}B'_{y2})_5O_{12}$, wherein $x1+x2+x3=1$, wherein $x3>0$, wherein $0<x2+x3\leq0.2$, wherein $y1+y2=1$, wherein $0\leq y2\leq0.2$, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially $x1>0$, such as $>0.2$, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (in combination with the first light source light and the second light source light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu,Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein $0<x2+x3≤0.1$, and wherein $0≤y2≤0.1$. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein $x1+x3=1$, and wherein $0<x3≤0.2$, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein $x1+x2+x3=1$, wherein $x3>0$, wherein $0<x2+x3≤0.2$, wherein $y1+y2=1$, wherein $0≤y2≤0.2$. Especially, x3 is selected from the range of 0.001-0.1. Note that in embodiments x2=0. Alternatively or additionally, in embodiments y2=0.

In specific embodiments, A may especially comprise at least Y, and B may especially comprise at least Al.

In yet further embodiments, in addition to the first luminescent material, the light generating device may also comprise one or more further luminescent materials, especially configured to convert part of one or more of the first light source light and first luminescent material light into further luminescent material light. Especially, in embodiments the light generating device may also comprise a second luminescent material, especially configured to convert part of one or more of the first light source light and the first luminescent material light into second luminescent material light. Further, especially the second luminescent material light has one or more wavelengths in the range of about 550-700 nm. Further, in specific embodiments the first luminescent material light has a full width half maximum (FWHM) of at least 25 nm, such as at least 40 nm, like in specific embodiments up to about 150 nm (at room temperature). Especially, the second luminescent material light has a color point in the amber and/orange. Especially, in embodiments the second luminescent material light has a dominant wavelength ($λ_{d1}$) selected from the spectral wavelength range of 590-605 nm, especially selected from the spectral wavelength range of 590-600 nm. Especially, at least 50% of the spectral power (in Watt) of the first luminescent material light, such as at least 70%, is within the range of 550-650 nm. The second luminescent material light may e.g. have a dominant wavelength in the amber and/or orange wavelength range. Examples of such second luminescent material may e.g. be $M_2Si_5N_8:Eu^{2+}$ and/or $MAlSiN_3:Eu^{2+}$ and/or $Ca_2AlSi_3O_2N_5:Eu^{2+}$, etc., wherein M comprises one or more of Ba, Sr and Ca, especially in embodiments at least Sr. Hence, in embodiments the light generating device may further comprise a second luminescent material configured to convert part of one or more of the first light source light and first luminescent material light into second luminescent material light. Especially, the second luminescent material and the first luminescent material are configured such, that the second luminescent material converts part of the first luminescent material light. Hence, in embodiments the second luminescent material may be configured to convert at least part of the first luminescent material light into second luminescent material light (whereby the first luminescent material light is red-shifted). Hence, in embodiments, second luminescent may comprise one or more materials selected from the group consisting of $(Ba,Sr,Ca)S:Eu$, $(Ba,Sr,Ca)AlSiN_3:Eu$ and $(Ba,Sr,Ca)_2Si_5N_8:Eu$. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in $CaAlSiN_3:Eu$, the correct formula could be $(Ca_{0.98}Eu_{0.02})AlSiN_3$. Divalent europium will in general replace divalent cations, such as the above divalent alkaline earth cations, especially Ca, Sr or Ba. The material $(Ba,Sr,Ca)S:Eu$ can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material $(Ba,Sr,Ca)_2Si_5N_8:Eu$ can also be indicated as $M_2Si_5N_8:Eu$, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as $Ba_{1.5}Sr_{0.5}Si_5N_8:Eu$ (i.e. 75% Ba; 25% Sr). Here, Eu is introduced and replaces at least part of M, i.e. one or more of Ba, Sr, and Ca). Likewise, the material $(Ba,Sr,Ca)AlSiN_3:Eu$ can also be indicated as $MAlSiN_3:Eu$, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art.

As indicated above, it may not only desirable to beam shape and/or redirect first light, it may also be desirable to beam shape and/or redirect the luminescent material light. In specific embodiments, the arrangement (in some specific embodiments especially the device) may further comprises a second optical element configured to beam shape the luminescent material light. In specific embodiments, the second optical element has a half-toroidal lens shape or a half-toroidal reflector shape. In other embodiments, the second optical element has a collimator shape, such as a hollow reflector.

In an embodiment, the arrangement may further comprise a control system. The control system may be configured to control the first light source. Alternatively or additionally, the control system may be configured to control a plurality of (different) first light sources. Alternatively or additionally, the control system may be configured to control the above described actuator. The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface. The control system may also be configured to receive and execute instructions form a remote control. In embodiments, the control system may be controlled via an App on a device, such as a portable device, like a Smartphone or I-phone, a tablet, etc. The device is thus not necessarily coupled to the arrangement (such as in embodiments a lighting system), but may be (temporarily) functionally coupled to the arrangement. Hence, in embodiments the control system may (also) be configured to be controlled by an App on a remote device. In such embodiments the control system of the lighting system may be a slave control system or control in a slave mode. For instance, the arrangement may be identifiable with a code, especially a unique code for the respective arrangement. The control system of the lighting system may be configured to be controlled by an external control system which has access to the arrangement on the basis of knowledge (input by a user interface of with an optical sensor (e.g. QR code reader) of the (unique) code. The arrangement may also comprise means for communicating with other systems or devices, such as on the basis of Bluetooth, WIFI, LiFi, ZigBee, BLE or WiMAX, or another wireless technology. The system, or apparatus, or device, or arrangement, may execute an action in a "mode" or "operation mode" or "mode of operation". Likewise, in a method an action or stage, or step may be executed in a "mode" or "operation mode" or "mode of operation" or "operational mode". The term "mode" may also be indicated as "controlling mode". This does not exclude that the system, or apparatus, or device, or arrangement, may also be adapted for providing another controlling mode, or a plurality of other controlling modes. Likewise, this may not exclude that before executing the mode and/or after executing the mode one or more other modes may be executed. However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, or arrangement, that can only operate in a single operation mode (i.e. "on", without further tunability). Hence, in embodiments, the control system may control in dependence of one or more of an input signal of a user interface, a sensor signal (of a sensor), and a timer. The term "timer" may refer to a clock and/or a predetermined time scheme.

In yet a further aspect, the invention also provides a luminaire or spotlight comprising the arrangement as defined herein, wherein the arrangement may especially comprise a laser light source as the first light source. The luminaire may further comprise a housing, optical elements, louvres, etc. etc.

The lighting device (or luminaire) may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting, etc.

The device may provide white light and/or colored light. In embodiments the device may provide colored light that may be perceived white due to the chosen frequency with which the colors are provided. The device light may comprise luminescent material light (in one or more operational modes). The arrangement may provide light that comprises in one or more operational modes device light of one or more of the herein described devices. Optionally, further devices may be available.

The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

In yet a further aspect, the invention provides a projector comprising the arrangement. The projector may comprise a laser light source or a plurality of laser light sources. The light source or plurality of light sources may be arranged on a heat sink (laser bank). The lasers may emit UV and/or blue light.

Further, in specific embodiments, the luminescent material comprising element may comprise a third luminescent material (or a different second luminescent material). For example, the laser may emit UV light, the luminescent material may comprise a blue phosphor, the second luminescent material may comprise a green/yellow phosphor, the third luminescent material may comprise an orange/red phosphor.

In embodiments, a phosphor wheel may comprise a light transmissive section and/or a light reflective section. The light transmissive section may be an opening or diffuser. The light reflective section may comprise a reflector/reflective material. In this way the first light, e.g. blue light, may be used as well. Hence, one or more sections of such phosphor wheel may be used to convert at least part of the first light and one or more sections may be used to reflect or transmit the first light, which may then be used per se. Hence, in embodiments the luminescent material comprising element may comprise one or more sections comprising one or more different luminescent materials and one or more sections that are configured to reflect or transmit the first light. The section(s) comprising luminescent material are especially configured to convert the luminescent material light (and not to transmit or reflect first light, though some (small) part may be reflected and or transmitted). The section(s) that are reflective or transmissive may especially have a higher reflection or transmission for the first light, than the section(s) comprising luminescent material.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 4a-4b schematically depict some embodiments;

DETAILED DESCRIPTION OF THE EMBODIMENTS

Pumping a ceramic phosphor with a focused blue laser diode can create a light source with 10-20 times higher luminance than a phosphor-converted white LED, thus enabling tighter beam angle spots or miniaturized luminaires. Low-power narrow-beam light sources consisting of a blue laser diode and a static ceramic Cerium-doped garnet phosphor plate exist. The luminance of the static phosphor configuration is limited by the limited heat spreading capacity of the phosphor, which causes thermal quenching of the phosphor when pumped above a certain blue laser power density. Mounting the phosphor on a spinning wheel may greatly improve the heat spreading, it may allow higher pumping power densities and may result in a higher luminance than in the static phosphor case. Such light engines can be found for instance be used in projection systems and stage lighting. Spinning wheel phosphor systems may be relatively bulky. Hence, there is a need for a laser-based light engine that is more compact than the current spinning phosphor wheel solutions, while providing a higher luminance than the current static phosphor solutions.

Amongst others, a compact laser light engine is described where blue laser light is converted by a ceramic phosphor that is mounted as a ring on a spinning transparent rod. The laser light enters the rod through a domed shaped end which focusses the light from the inside of the rod onto the phosphor. The spinning rod can be made from sapphire, providing improved heat management of the phosphor. This may provide a more compact system compared to a phosphor wheel solution, higher luminance compared to a static phosphor solution.

Figure 1A:
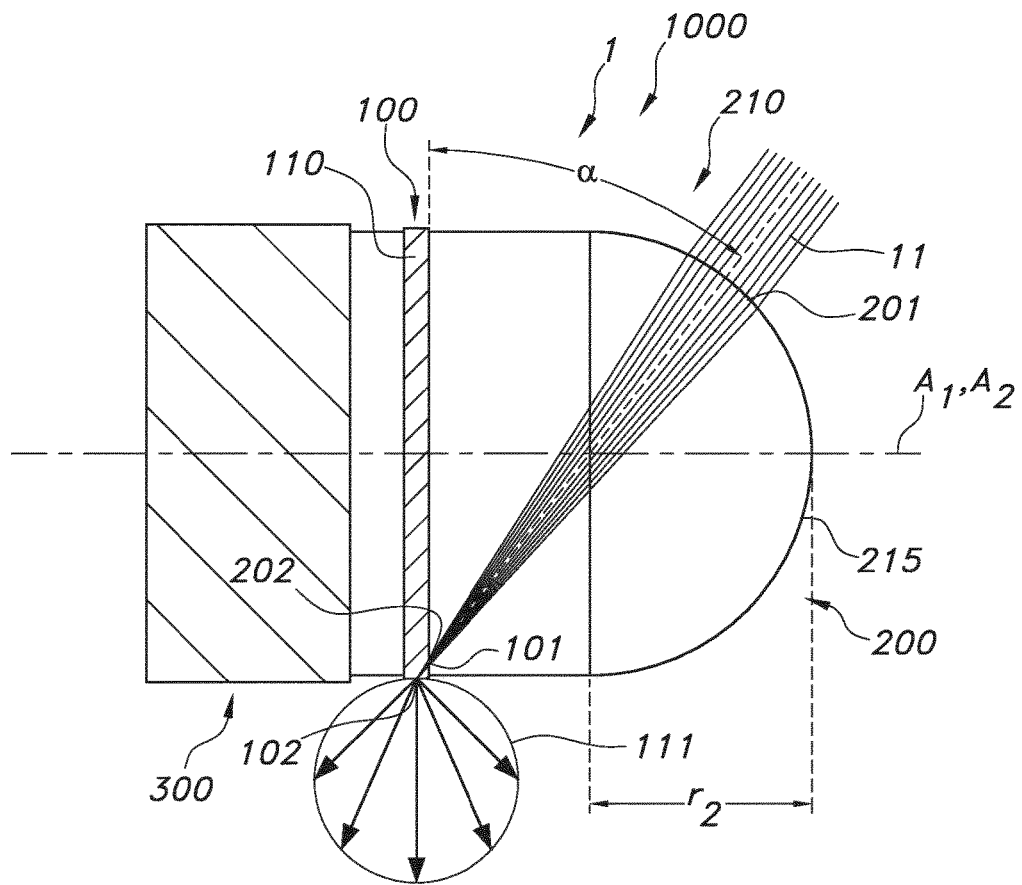
FIGS. 1a-1f schematically depict some aspects and embodiments.

The principle of operation of a number of the herein described embodiments is shown in FIG. 1a. A transparent rod made e.g. of sapphire is mounted on a rotating metal shaft. The sapphire rod has a transparent dome-shaped cap through which a blue laser beam is directed. The dome acts as a lens, focusing the blue light onto a spot at the cylindrical part of the sapphire rod where a ring of ceramic phosphor material is mounted. Hence, amongst others a phosphor on a rotating rod is proposed. In the example, the sapphire rod has a semi-spherical cap, acting as a focusing lens for the blue laser. Focus point is on the inner rod surface, where the phosphor is located, in a ring shape. In this example: radius rod=5 mm; wavelength=450 nm; refractive index=1.7794; sharpest focus at incidence angle ($\alpha$)=38°; position of phosphor ring=3.9 mm from cap. See for the angle of incidence FIG. 1a.

FIG. 1a schematically depicts an embodiment of an arrangement 1 comprising a device 1000. The device 1000 comprises a luminescent material comprising element 100 and a light transmissive element 200. Further, in this embodiments the device 1000 comprises a thermally conductive material (other than the light transmissive element 200 which may also have thermal conductivity). The device 1000 has a first device axis A1. This may be an axis of rotation.

The luminescent material comprising element 100 comprises a luminescent material 110 configured to emit luminescent material light 111 upon irradiation with first light 11 (which may in embodiments be blue light). The luminescent material comprising element 100 has a first length L1 and a characteristic first dimension D1 perpendicular to the first length L1. For instance, in embodiments D1/L1<1. The luminescent material comprising element 100 is configured at a non-zero first distance r1 from the first device axis A1. Further, the luminescent material comprising element 100 at least partly surrounds the first device axis A1.

The light transmissive element 200 is transmissive for the first light 11. The light transmissive element 200 comprises an element light entrance part 201 (for the first light 11) and an element light escape part 202 (for the first light 11). The element light escape part 202 and the luminescent material 110 are radiationally coupled. One or more of the following may apply: (i) the first device axis A1 intersects the light transmissive element 200, and (ii) the light transmissive element 200 at least partly surrounds the first device axis A1. Here, the first, but also in fact, the second condition apply.

The luminescent material comprising element 100 may have a second external diameter (relative to the first device axis), such as the larger diameter of a ring. Further, the luminescent material comprising element 100 may have a third smallest diameter (relative to the first device axis) or internal diameter, such as the smaller diameter from a ring). The third diameter may especially in embodiments be equal to the first distance r1. The third diameter may in embodiments be smaller than the first external diameter, but the latter may be smaller than the second external diameter. For instance, the ring may have a larger diameter than the dome, for instance in embodiments 1-20% larger than the dome diameter. This might improve light extraction from the phosphor as light might also escape from the side facets of the phosphor, not only from the top surface.

The luminescent material comprising element 100 is in thermal contact with one or more of (a) the light transmissive element 200 and (b) an optional thermally conductive element 300.

FIG. 1a also schematically depicts an embodiment wherein the luminescent material comprising element 100 is mechanically coupled to the light transmissive element 200 and/or the (optional) thermally conductive element 300. The latter may be a heat sink or may be thermally coupled to a heat sink. In specific embodiments, the light transmissive element 200 has a thermal conductivity of at least 10 W/m/K. The device 1000 may thus further comprise such thermally conductive element 300. Especially, the thermally conductive element 300 may be in thermal contact with the light transmissive element 200. The thermally conductive element 300 may be a heat sink or may be thermally coupled to a heat sink (not depicted).

Figures 1B, 1C, 1D:
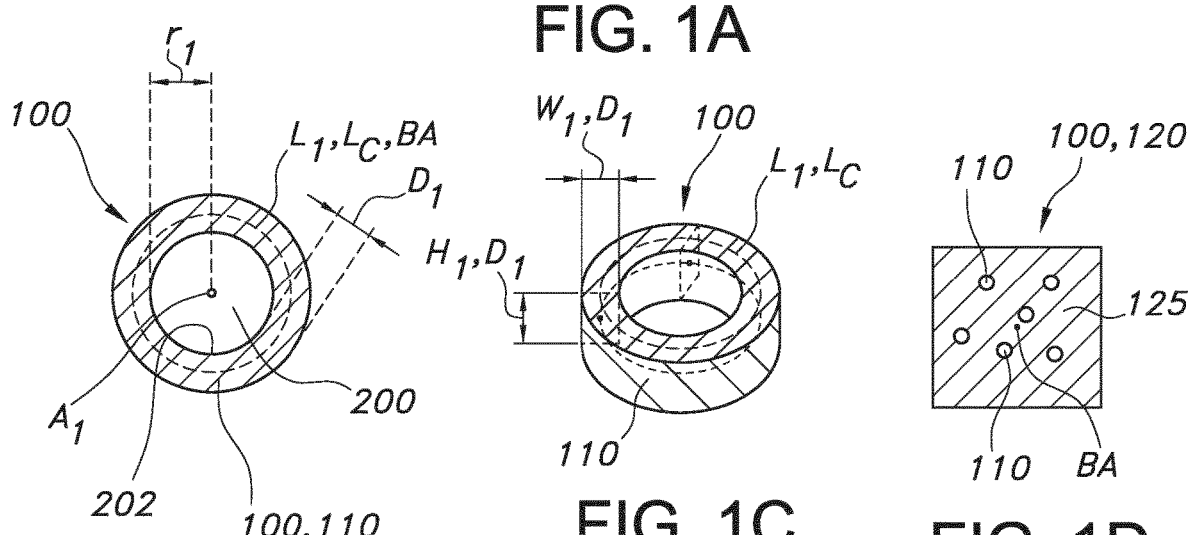

In embodiments, the luminescent material comprising element 100 surrounds the first device axis A1 and has a shape selected from circular, rectangular, hexagonal, octagonal, and decagonal, see also FIGS. 1b and 1c. For instance, the luminescent material comprising element 100 may have a ring-like shape. The first length L1 may be a circular length Lc. The circular length may be the length of the average circumference of the ring-like shape. The characteristic first dimension D1 may be a height H1 or width W1 of the luminescent material comprising element 100. In specific embodiments, D1/L1≤10.

Reference BA indicates a body axis. Such body axis may be configured at a length averaged distance to the external surface(s) of the luminescent material comprising element. In the cross-section (see dashed rectangle in FIG. 1b), it is the middle of the cross-section (rectangle).

Referring to FIG. 1c, in case of a ring-like shape, the ring may have first length (see also below) which is essentially the same as circular length (i.e. 2*π*r, wherein r may e.g. be an average radius (between a largest radius and a smallest radius of the ring). The characteristic first dimension may be the height H1 or the width W1, but may especially be a circular equivalent diameter (not shown) of the cross-section of the ring-like shape perpendicular to the first length. The average radius may be defined by a body axis at ½*W and ½*H1. Any cross-section to the luminescent material comprising element may have a middle point. When connecting the middle points, the body axis (dashed line) may be obtained.

Instead of a circular shape, the shape may also be rectangular, hexagonal, octagonal, or decagonal. Especially, the shape may be circular, hexagonal, octagonal, or decagonal. Even more especially circular (like a ring).

In embodiments, the luminescent material comprising element 100 may comprise a ceramic body comprising the luminescent material 110. In yet other embodiments, the luminescent material comprising element 100 may comprises a polymeric body 120 comprising the luminescent material 110 distributed in the polymeric body 120, wherein the polymeric body 120 comprises a polymeric material 125. The luminescent material 110 may be dispersed in the polymeric material 125. An embodiment is schematically depicted in FIG. 1d. FIG. 1d schematically depicts a cross-section of an embodiment of the luminescent material comprising element 100. The polymeric material 125 may e.g. comprise silicone.

As schematically depicted in amongst others FIG. 1a, the light transmissive element 200 may comprise a dome-shaped body 210 having a curved surface 215. At least part of the curved surface 215 comprises the element light entrance part 201. Another part of the dome-shaped body 210, such as in embodiments another part of the curved surface 215, or yet another part, like in FIG. 1a, may comprise the light escape part 202. The light transmissive element 200 has a transmissive element axis A2. Here, in this embodiment the first device axis A1 and the transmissive element axis A2 (essentially) coincide. Especially, the dome-shaped body 210 may be configured to focus the first light 11 (of a first light source) on or in the luminescent material comprising element 100.

As schematically depicted in FIGS. 1a and 1b, the luminescent material comprising element 100 at least partly surrounds the light transmissive element 200. The luminescent material comprising element 100 may comprise an element entrance part 101 and an element escape part 102. At least part of the luminescent material is configured between the element entrance part 101 and the element escape part 102, at least in the embodiments schematically depicted in FIG. 1a and some other figures, where the luminescent material comprising element 100 is especially configured in the transmissive mode. In a reflective mode (see below), the element entrance part 101 and the element escape part 102 may in embodiments overlap or even coincide. The element entrance part 101 and element light escape part 202 are radiationally coupled. In embodiments, especially in a reflective mode, the element entrance part 101 may be configured closer to the first device axis A1 than the element escape part 102.

Figure 1E:
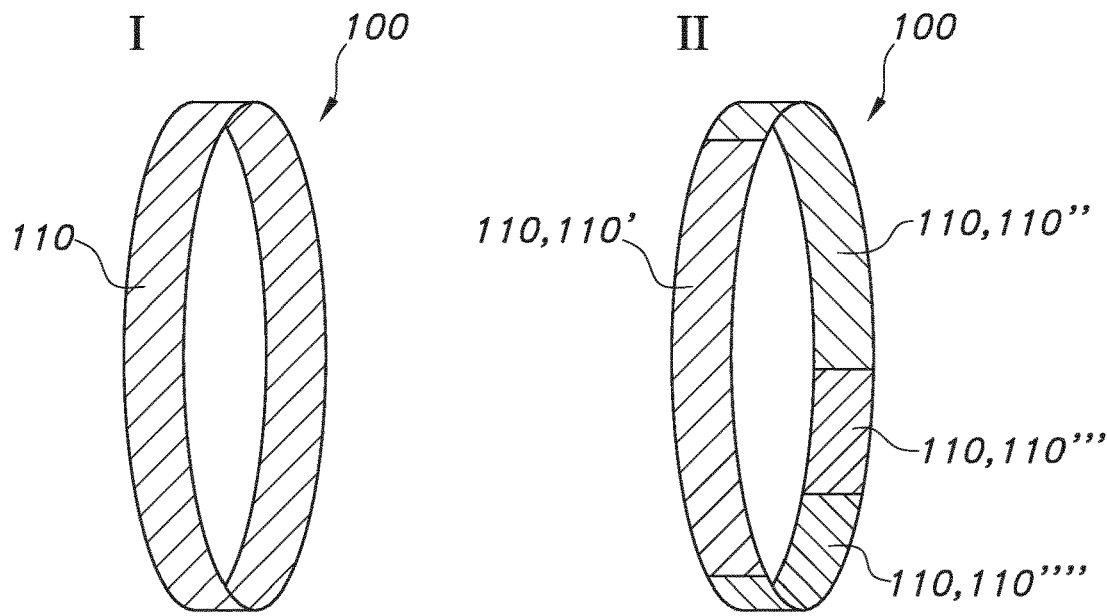

The luminescent material comprising element 100 may have a ring-shape. The luminescent material comprising element 100 may comprise a single luminescent material 110. However, the luminescent material comprising element 100 may also comprise a plurality of different luminescent material 110, which may optionally be configured separately. The ring-shaped luminescent material comprising element 100 ("phosphor ring") may thus comprise a single luminescent material 110, see FIG. 1e embodiment I. However, in alternative embodiments the ring-shaped luminescent material comprising element 100 may be sectorized, e.g. in RGBY sectors, as schematically shown in FIG. 1e embodiment II. This can be applied to improve color rendering or to adapt the color temperature according to the application needs. One or more light source may be applied. When different luminescent materials 110 are applied, optionally different types of light sources may be applied, provide light source light optimized for the different luminescent materials. Different luminescent material in different sectors or sections are indicated with references 110', 110", 110''', and 110''''. Here, by way of example four different luminescent material are applied. However, also less or more different luminescent materials may be applied. One or more section may also be reflective or transmissive (and do essentially not comprise a luminescent material (that can be excited by a light source that also excites the (other) luminescent material(s)). Different luminescent materials may be selected such, that all may be excited by the same first light source. However, alternatively or additionally two or more different first light sources may be applied to excite different luminescent materials, whereby at least one of the light sources may be able to excite at least one of the luminescent materials. It may also be possible that two or more of the two or more different first light sources may be able to excite the same luminescent materials.

Figure 1F:
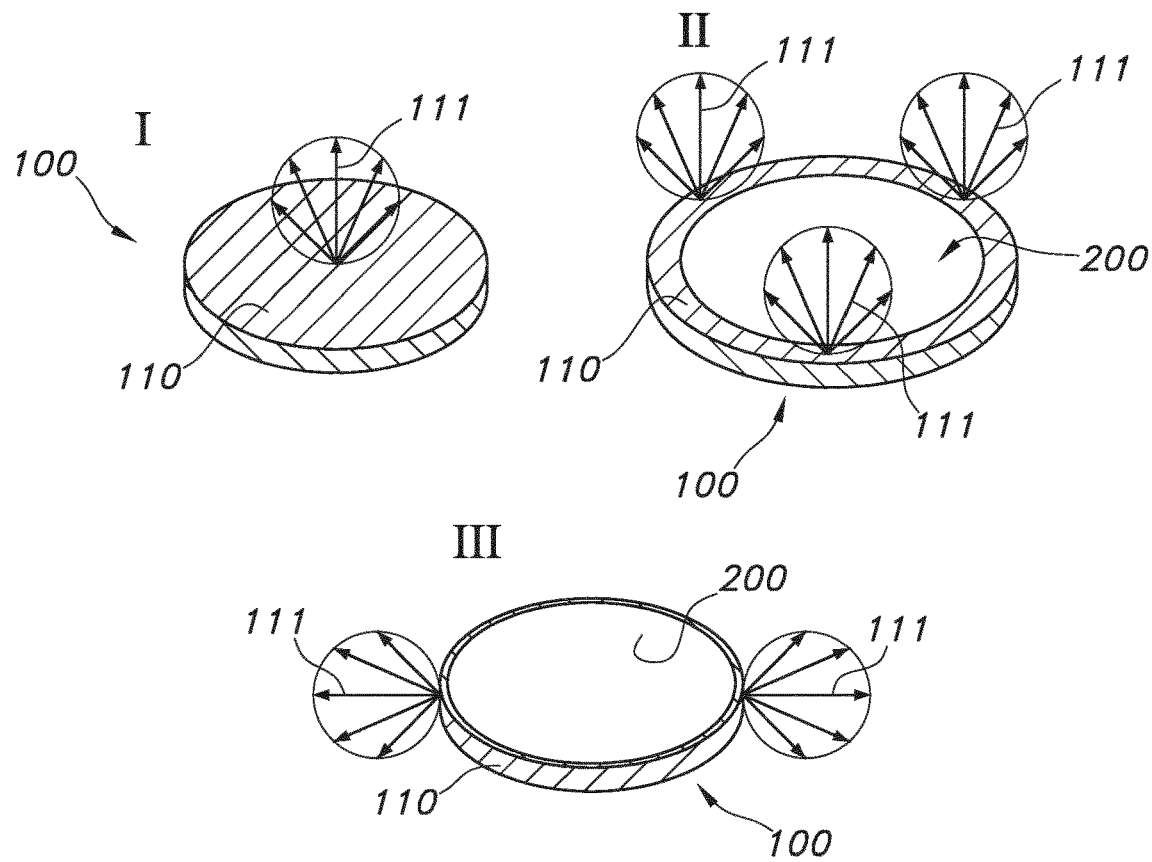

FIG. 1f schematically depicts three variants. The first variant I, is a disk like luminescent material comprising element 100. Especially, such variant may not be part of most—if not all—of the herein described embodiments. Variant II schematically depicts a ring-like luminescent material comprising element 100, which may be configured around light transmissive material of the light transmissive element 200. Note that light transmissive material of the light transmissive element 200 may also be above or below, or sandwich (i.e. above and below) the ring-like luminescent material comprising element 100. Variant II schematically depicts an embodiment wherein more luminescent material light 111 may escape from a top layer or bottom layer than from an edge. Variant III, however, schematically depicts an embodiment wherein less luminescent material light 111 may escape from a top layer or bottom layer than from an edge.

Figure 2A:
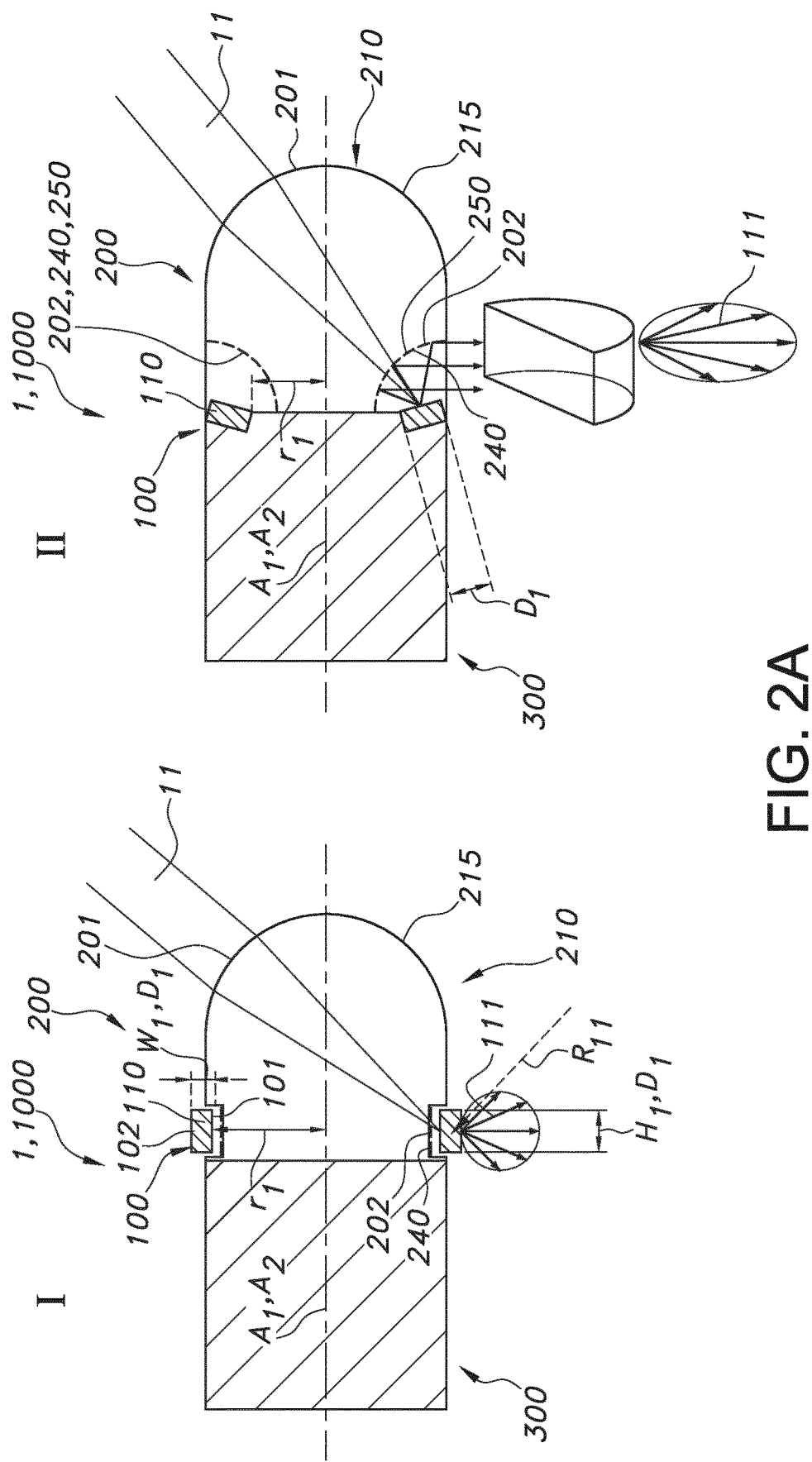
FIGS. 2a-2d schematically depicts some further aspects and embodiments.
Figure 2C:
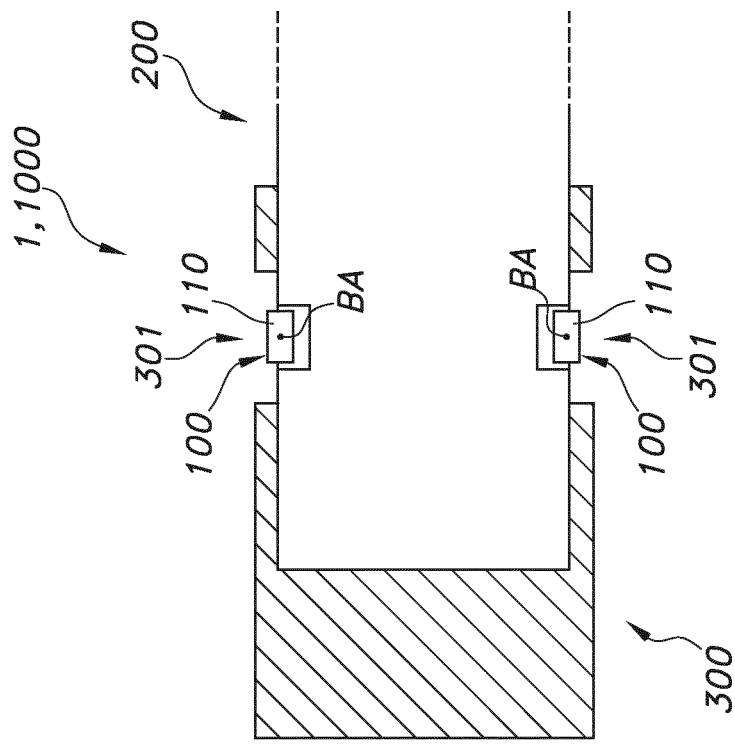
Figure 2B:
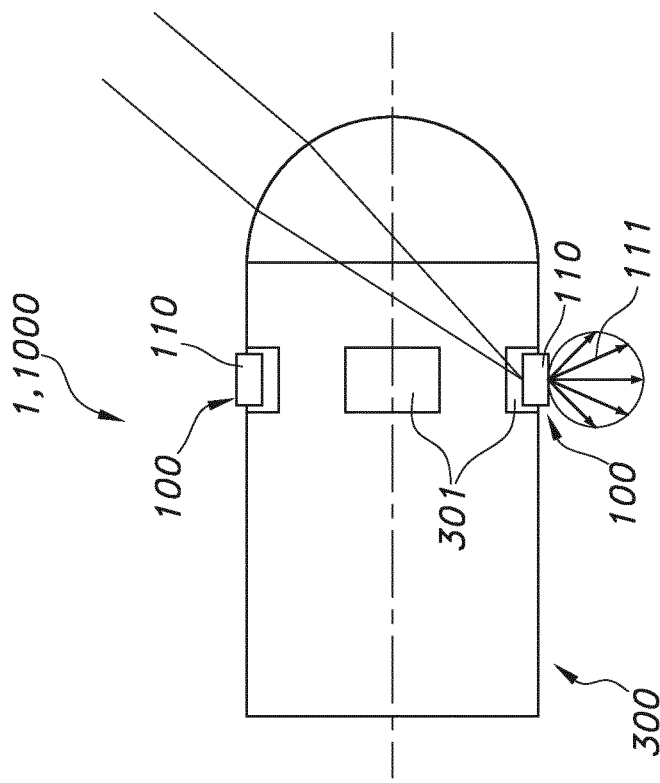

Amongst others, variants II and III allow at least 25%, such as at least about 50%, such as 50-75%, of the external surface of the luminescent material comprising element being in thermal contact with one or more of (a) the light transmissive element and (b) the optional thermally conductive element (see e.g. FIGS. 1a, 2a, and 2b).

As schematically depicted in the drawings, the device axis may be configured perpendicular to a plane parallel to the ring-shaped luminescent material comprising element.

Optionally, a dichroic coating is provided for higher collection efficiency of the converted light, as shown in FIG. 2a on the left (embodiment I). On the right, embodiment II in FIG. 2a, it is shown that the transparent rod can have a parabolic-shaped region to collimate the converted light, possibly in combination with a cylindrical lens. Reference 240 refers to a dichroic coating and reference 250 refers to a parabolic reflector. This parabolic reflector is essentially provided by the shape of the light transmissive element 200. Hence, in embodiments at least part of the light transmissive element 200 may be configured as parabolic reflector 250 for the luminescent material light 111. Hence, optionally a dichroic coating may be provided for higher collection efficiency of the converted light (embodiment I). Optionally, a transparent rod can have a parabolic-shaped region to collimate the converted light (embodiment II).

Embodiment I is also a transmissive mode embodiment, whereas embodiment II is a reflective mode embodiment.

In embodiment I, the (ring-shaped) luminescent material comprising element 100 protrudes from the light transmissive element 200. In embodiment II, the luminescent material comprising element 100 is configured in a cavity, which is shaped such that a (type) of parabolic reflector is created. The curvature may further assist in focusing. Reflection (especially back reflection of the luminescent material light 111), in both embodiments, may be reduced by a reflector 240. Especially the reflector 240 is transmissive for first light 11 but reflective for luminescent material light 111. Hence, the reflector 240 may be a dichroic reflector, like a dichroic coating.

In embodiments, the thermally conductive element 300 may be thermally coupled to a single face of the light transmissive element 200. Thermal coupling may be increase by increasing the contact surface. In embodiments, the thermally conductive element, such as a copper shaft (or shaft of other metal), may be extended or adapted as shown in FIG. 2b to improve the conductive thermal path or create forced convection. A cross-sectional view of the embodiment of FIG. 2b is schematically depicted in FIG. 2c. Reference 301 refers to an opening in a wall element of the thermally conductive element 300. Hence, the thermally conductive element 300 may comprise a hollow part in which the light transmissive element 200 at least partly resides. Further, the thermally conductive element 300 may comprise a wall part, at least partially enclosing the light transmissive element 200, which wall part may comprise an opening 301 for the luminescent material comprising element 100 or for escape from luminescent material light 111 from the luminescent material comprising element 100 via the opening 301.

Figure 2D:
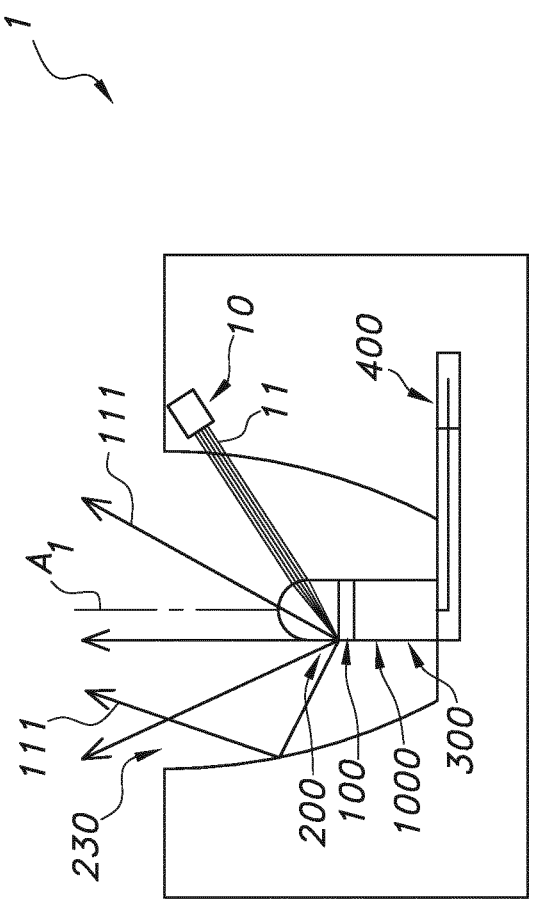

FIG. 2d schematically depicts an embodiment of the arrangement 1 which further comprises a first light source 10 configured to generate the first light 11. Especially, the first light source 10 comprises a laser light source, such as a laser LED. At least part of the collimation of the laser light may be provided by the light transmissive element 200, here comprising a dome.

FIG. 2d also schematically depicts an embodiment wherein the arrangement 1 further comprises an actuator 400 configured to rotate the luminescent material comprising element 100 about the first device axis A1. Especially, during an operational mode of the arrangement 1 the luminescent material comprising element 100 rotates about the first device axis A1 and the first light source 10 is configured stationary relative to the rotating luminescent material comprising element 100. The arrangement may comprise a single light source 10. However, in other embodiments two or more light sources 10 may be available. In yet further embodiments, two or more different types of first light sources 10 may be available.

Hence, amongst others the invention provides a laser light engine comprising a rotating transparent rod with dome-shaped end cap through which blue laser light is focused onto a ring-shaped area of ceramic phosphor. The rod may be from sapphire. The phosphor ring may be sectorized, e.g. in RGBY. A dichroic coating may be provided to increase the efficiency. Further, the rod may be mounted on a shaft which is adapted to improve the thermal path. This may allow a high brightness light sources with good color quality, e.g. for use as retail spot, entertainment spot, narrow beam width spot, etc.

It seems that the heat spreading capacity is improved by pumping the phosphor in the indicated way through the dome-shaped cap. To prove this, a thermal simulation model was used. In these simulations the temperature distribution is calculated assuming a 30W thermal input distributed over the full ring-shaped phosphor. This corresponds to the heat that is generated when pumping a 1 mm$^2$ spot with 100W of blue laser light. Due to the fast rotation of the rod this heat is spread out over the full phosphor ring. Cooling takes place by convection into the air and by conduction through the copper shaft. In the model it is not calculated what the temperature in the focused laser spot is, but what the quasi-stationary temperature distribution in the phosphor ring will be, i.e. of the phosphor that enters the laser spot by rotation of the rod. Two situations are compared: one where the blue laser light is incident through the sapphire rod, as intended (see e.g. FIG. 2a), and the other where the laser light is incident from the air (see ref. R11 in FIG. 2a). Surprisingly, in both cases the highest temperature is at the phosphor-air interface, although in the left case the laser is incident at the sapphire-phosphor interface. The respective Tmax are 91.9° C. and 99.5° C. Further, the temperature of the phosphor at the side where the laser enters is 87.5° C. and 99.5° C. respectively. There is a substantial and significant temperature difference of $\Delta T=12°$ C. Hence, it is concluded that to prevent thermal quenching of the phosphor it is advantageous when the blue laser light is incident through the sapphire rod. In a thermal model simulation (with reduced input of 5 W thermal instead of 30 W) the temperature at the inside of the phosphor when pumping from the inside reaches 59° C. and at the outside when pumping from the outside 111° C., a difference of 52° C.

Architectures of laser-based light sources may comprise a blue pump laser and a ceramic phosphor (usually a YAG:Ce based) illuminated either in transmissive or reflective mode. All the phosphor converted laser-pumped sources are essentially Lambertian emitters, and brightness may especially be determined by the amount of emitted flux and the area of the source. In order to maximize the source brightness the area of the phosphor tend to be minimized and the directionality of pump laser light make it possible to deliver high pump power to these small phosphor area. Yet the factor which usually limits possibly achieved high brightness is a thermal quenching of a phosphor at high temperatures resulted from high power densities of the laser pump (usually in the range of 10-30 W/mm$^2$ depending on the module and phosphor architecture). In a reflective or transmissive pumping architecture, the phosphor may have a compact regular shape (round, square, hexagonal shape) either embedded in a transparent material with high thermal conductivity or thermally attached to a metal heatsink with a highly reflective substrate. For the laser-based sources which require do deliver high luminous flux (in the range of 10 klm (kilo lumen) as e.g. for entertainment lighting fixtures) the phosphor size grows rapidly which can result in more problems with cooling and formation of hot-spots (in the center of a sample).

A comparison of phosphor samples performance of different size ranges used in a reflective mode and having similar thermal interface to a heatsink (silicone bond with optimized thickness of approx. few microns) was made. Results of thermo-optical tests with silicone bonded phosphor samples of different sizes at maximum temperature and onset of thermal quenching for 10 mm$^2$ area samples were generated. The maximum power density realized was 18 W/mm$^2$. Similarly, results were generated for a smaller phosphor of 0.5×0.5 mm$^2$. The smaller phosphor sample allowed to reach pump power densities in the of order of >30 W/mm$^2$ (with 0.5×0.5 mm2 samples), while for a large phosphor samples (10 mm$^2$) thermal quenching effects manifest already at a level of 17 W/mm$^2$ (all with silicone bonding to heatsink). Therefore for the sources where high flux and hence larger phosphor area is required alternative phosphor geometries resulting in better thermal management might be preferred.

Herein, alternative phosphor geometries for laser-based light sources are proposed which would allow for a better thermal management and finally higher brightness, compared to the regular shape top-emitting phosphor of the same area. It appeared to be possible to manage the light effectively from these alternative source shapes resulting in comparable collimated beam performance.

Amongst others, it is (again) referred to FIG. 1f. Two alternatives for regular compact shapes of the phosphor are proposed. The possible shapes are sketched in FIG. 1f, variants II and III. Variant I shows a compact shape of a phosphor and variants II and III, the alternative ring-shape with top-emitting phosphor and alternative ring shape with side emitting phosphor, respectively. Hence, as alternative to a top-emitting (round) shape a top-emitting ring source or a side-emitting ring source are proposed. The geometries of alternative phosphor source shapes in case of high intensity laser excitation may favor better lateral heat spreading and reduce the probability of a hot-spots formation, which would finally result in a higher achievable source brightness.

Regular 2D-shapes of phosphor converters may be used for LEDs but also for laser-converted light sources. They may be compact and may allow an easy light management. An ideal starting situation for a light source for light manipulation/beam shaping may be a point source. Yet when higher flux output is required, the phosphor size may also grow, due to practical limitations of thermal interfaces to a heatsink and maximum laser pump power density on a phosphor. From a regular 2D-shape source the heat transfer to a heatsink goes in a phosphor plane (laterally) and directly to a heatsink. The lateral heat spreading appear to become less efficient for a larger converter sizes. Therefore, it may be beneficial to go from 2D-phosphor shapes to 1D-shapes which would make lateral heat transfer more efficient. Transforming a circle shape to a line shape can be an option, but efficient light management (e.g. making a narrow collimated beam of light) from a line source appears to be challenging. Closing a line source into a ring, thus making quasi 1D-phosphor ring shape (see amongst others variants II and III in FIG. 1f) with more efficient heat spreading makes the light management also easier.

In the examples described herein and/or depicted, it appears that is possible to make comparable collimated beams starting from sources of different ring-shapes. Reflector optics combined with each source type were modelled in order to create a tight collimated beam. To have comparable results we chose to have equal emitting area of different source shapes of 10 mm$^2$ and a maximum fixed reflector diameter of 50 mm.

As a reference situation we chose a top-emitting round phosphor of 10 mm$^2$ area (03.57 mm). A side-emitting ring-phosphor of the same diameter 03.57 mm would have a width of a phosphor layer of 0.89 mm in order to have the same emitting area of 10 mm$^2$. And a top emitting ring with 0.9 mm ring thickness would have inner and outer diameters of 6.6 mm and 7.5 mm respectively. A reference source combined with parabolic reflector of 26.2 mm height above the source results in a collimated beam of 5.6° FWHM with a center beam power of 52.1 cd/lm. The height of the reflector determines the beam width and the amount of uncontrolled spill light, not interacting with the reflector walls. We have chosen here a reflector height of 26.2 mm (from the source) as a reference situation.

Figure 3B:
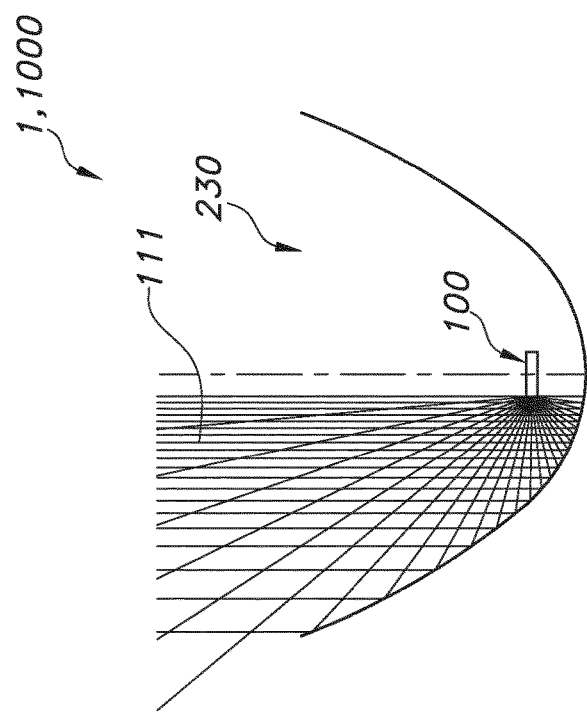
FIGS. 3a-3b schematically depict some embodiments.

An alternative shape of a phosphor converter is a ring-shape, where a phosphor width is much smaller than its length along the circumference. An example of such an architecture is shown in FIG. 3b, with a phosphor ring diameter of 3.57 mm and phosphor width of 0.89 mm. In this example embodiment a phosphor is attached to optically transparent rod made out of good heat conducting material (e.g. sapphire). In the example light is collected and collimated by a parabolic reflector having its focus on a phosphor. With the same output diameter of a reflector this results in a beam of 5.75° FWHM with center beam power of 48.3 cd/lm. The phosphor pumping can be realized by using a reflector on a top of a rod, directing the pump beam towards a phosphor ring. The transparent rod can have a round cross-section, but also a polygonal (e.g. hexagonal) cross-section. The rod can be attached to a metal heatsink to facilitate further heat removal in a system. The optical performance of this configuration is very similar to the original performance of a reference compact source, but at the same time this concept offers additional benefits in thermal management, such that higher brightness can be achieved.

Hence, in embodiments (see e.g. FIG. 3a) the light transmissive element 200 may comprise a first reflective element 220 configured to redirect first light 11 from the first light source 10, such as a laser light source, to the luminescent material comprising element 100 and/or to redirect luminescent material light 111. Especially, in an operational mode of the arrangement 1 the first light source 10 is configured stationary relative to the luminescent material comprising element 100. Reference 20 refers to beam shaping optics for the light source 10, such as a laser LED.

Figure 3A:
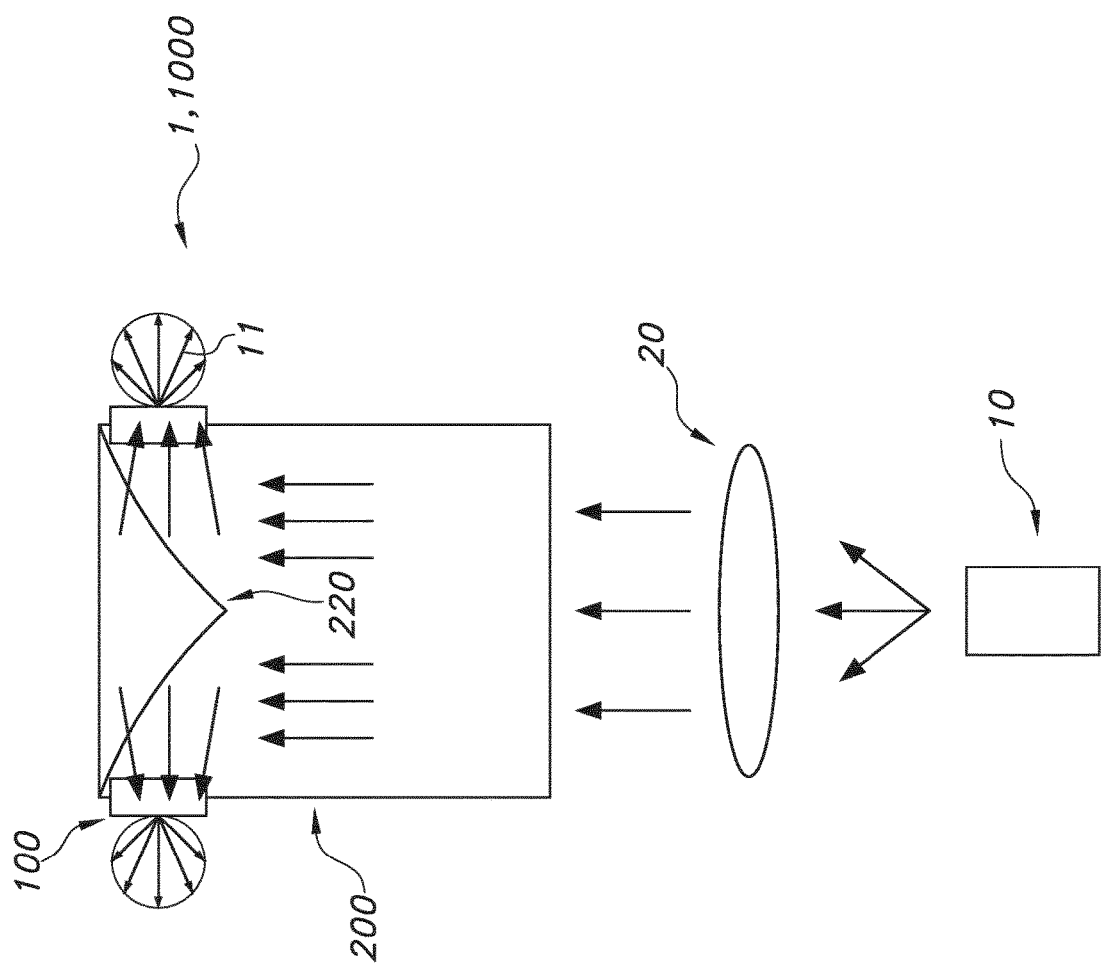

FIG. 3a also shows an embodiment wherein the first reflective element 220 is configured to distribute the first light 11 over the luminescent material comprising element

100. Especially, the luminescent material comprising element 100 may thus have a ring-shaped structure. Further, FIG. 3b shows an embodiment, wherein the arrangement 1 further comprises a second optical element 230 configured to beam shape the luminescent material light 111. The device 1000 of FIG. 3a may at least partly be arranged in the second optical element 230 of FIG. 3b. In this way, the luminescent material light 111 that is emitted sideways, may leave the arrangement 1 via the exit of the second optical element 230 as a (more) collimated beam of luminescent material light 111.

FIG. 4a schematically depicts an embodiment of a top-emitting ring-shape phosphor (in a transmissive configuration) a double-reflector. The first, inner reflector has a shape of revolved parabola and directs a collimated beam of light to the side, towards a second reflector. This second reflector has almost straight walls tilted to redirect the light in the normal direction to the source. The amount of uncontrolled spill light is determined by the focal point and the size of the first reflector. The modelled beam width is 3.1° FWHM and a center beam power is 34.5 cd/lm. In this example it is possible to reach even narrower beam than in reference situation but at a cost of beam intensity, due to larger amount of uncontrolled light. One of the advantages of this configuration is that the height of reflector can be reduced (15 mm in the example shown). The presented example of a design does not represent ultimate performance numbers in this architecture, but rather shown as an illustration of possible optical solution which can be optimized further. It is also possible to use lens optics for a beam shaping with a ring source, for instance as sketched in the FIGS. 4a-4b, with half-toroidal lens placed on the top of the phosphor ring. As an example of optics used for shaping a pump laser beam into a ring an axicon-type of lens is shown, transforming a parallel (or slightly converging) laser beam into a ring shape for phosphor excitation.

FIG. 4a schematically depicts an embodiment wherein the device 1000 further comprises such second optical element 230 configured to beam shape the luminescent material light 111. Here, in by way of example the second optical element 230 has a half-toroidal lens shape. References 20' and 20" refer to beam shaping optics 20 for the light source 10, such as a laser LED.

FIG. 4b schematically depicts an alternative arrangement including a further second optical element 230. Reference 231 and 232 refers to outer and the inner reflector, respectively. Hence, different solutions are displayed in FIGS. 4a and 4b, which may be used alternatively. The device 1000 of FIG. 4a may at least partly be arranged in the second optical element 230 of FIG. 4b.

Figure 5:
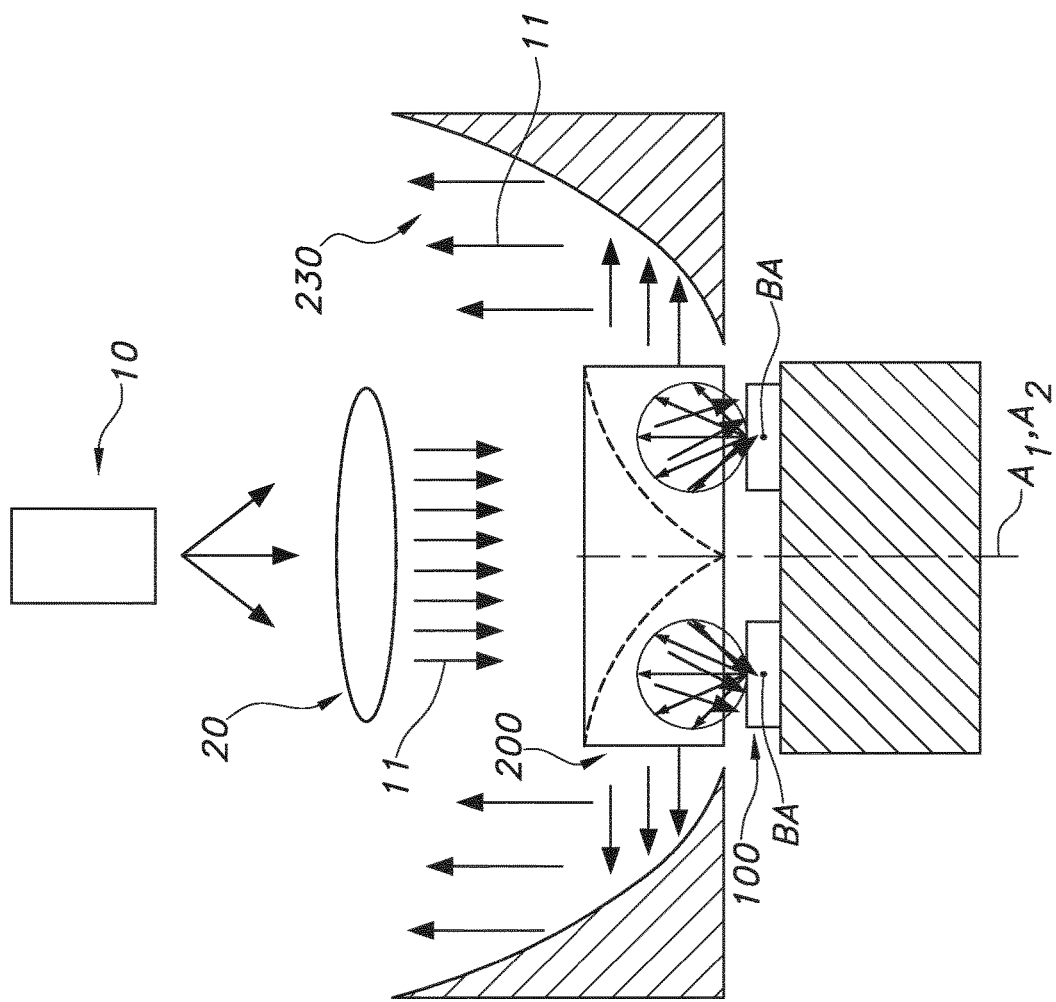
FIG. 5 schematically depict some embodiments.

FIG. 5 schematically depicts an embodiment of a top-emitter with reflective architecture. For more efficient heat removal from a phosphor a reflective architecture is preferred. A phosphor ring is mounted on a (metal) heatsink with highly reflective surface. Above the phosphor placed the optical element having the axial rotational symmetry. The element acts as a lens focusing incoming blue laser beam into a ring of pump light on a phosphor. On a top of the element a dichroic coating is provided which transmits blue light and reflects green-yellow phosphor converted light. The converted light from the phosphor is reflected by this coating to the sides and directed towards a reflector, which captures and direct the collimated beam of light to the far field normal to the source.

The invention can be applied in the applications where high source brightness is required, e.g. in retail and hospitality lighting, entertainment lighting. Amongst others, the invention may provide a static laser-pumped phosphor configuration where phosphor has quasi-1D dimensionality (ring-shape phosphor where it's dimension in one direction (width) is much smaller than dimension in the other direction (length or circumference)). In embodiments, a shape of circumference is a circle, (a square), a hexagon, etc. In embodiments, a phosphor is attached on a transparent optical material with good heat conductivity (e.g. sapphire) or non-transparent heatsink (e.g. copper or ceramics or a combination). Yet further, in embodiments a dominant direction of phosphor emission is perpendicular to the plane of the phosphor shape (e.g. top-emitting ring) or in plane of the phosphor shape (side emitting ring).

Figure 6:
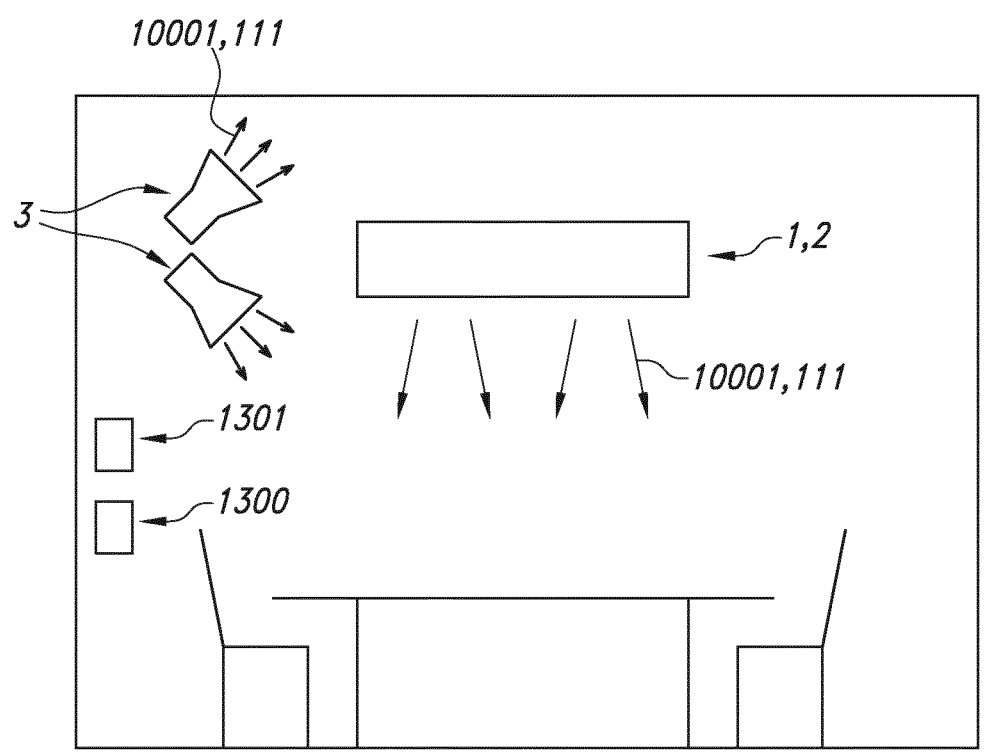
FIG. 6 schematically depict some embodiments. The schematic drawings are not necessarily to scale.

Referring to FIG. 6, the invention also provides a luminaire 2 or spotlight 3 comprising the arrangement 1 as defined herein. Especially, the arrangement 1 may comprise the first light source 10 comprising a laser light source. Reference 1300 refers to a control system and reference 1301 refers to a user interface, functionally connected to the control system 1300. Reference 10001 refers to the light of the luminaire or spotlight, which comprises in one or more operational modes at least luminescent material light of one or more devices.

The term "plurality" refers to two or more.

The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%.

The term "comprise" includes also embodiments wherein the term "comprises" means "consists of".

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. An arrangement comprising a device, wherein the device comprises a luminescent material comprising element and a light transmissive element, wherein:
   the device has a first device axis;
   the luminescent material comprising element comprises a luminescent material configured to emit luminescent material light upon irradiation with first light, wherein the luminescent material comprising element has a first length and a characteristic first dimension perpendicular to the first length, wherein $D1/L1<1$; wherein the luminescent material comprising element is configured at a non-zero first distance from the first device axis, and wherein the luminescent material comprising element at least partly surrounds the first device axis;
   the light transmissive element is transmissive for the first light, wherein the light transmissive element comprises an element light entrance part and an element light escape part, wherein the element light escape part and the luminescent material are radiationally coupled; wherein one or more of the following applies: (i) the first device axis intersects the light transmissive element, and (ii) the light transmissive element at least partly surrounds the first device axis; and
   the luminescent material comprising element is in thermal contact with one or more of (a) the light transmissive element and (b) an optional thermally conductive element,
   wherein the light transmissive element comprises a dome-shaped body having a curved surface, wherein at least part of the curved surface comprises the element light entrance part, wherein the light transmissive element has a transmissive element axis, wherein the first device axis and the transmissive element axis coincide.

2. The arrangement according to claim 1, wherein the luminescent material comprising element is mechanically coupled to the light transmissive element and/or (b) the optional thermally conductive element.

3. The arrangement according to claim 1, wherein the luminescent material comprising element surrounds the first device axis and has a shape selected from circular, rectangular, hexagonal, octagonal, and decagonal.

4. The arrangement according to claim 1, wherein the luminescent material comprising element has a ring-like shape, wherein the first length is a circular length (Lc), wherein the characteristic first dimension is a height or width of the luminescent material comprising element, and $D1/L1 \leq 10$.

5. The arrangement according to claim 1, wherein the luminescent material comprising element comprises a ceramic body comprising the luminescent material.

6. The arrangement according to claim 1, wherein the luminescent material comprising element comprises a polymeric body comprising the luminescent material distributed in the polymeric body wherein the polymeric body comprises a polymeric material comprising silicone.

7. The arrangement according to claim 1, wherein the luminescent material comprising element is mounted on a sapphire rod.

8. The arrangement according to claim 1, wherein the dome-shaped body is configured to focus the first light on or in the luminescent material comprising element.

9. The arrangement according to claim 1, further comprising a first light source configured to generate the first light, wherein the first light source comprises a laser light source.

10. The arrangement according to claim 9, wherein the arrangement further comprises an actuator configured to rotate the luminescent material comprising element about the first device axis, and wherein during an operational mode of the arrangement the luminescent material comprising element rotates about the first device axis and the first light source is configured stationary relative to the rotating luminescent material comprising element.

11. The arrangement according to claim 1, wherein the luminescent material comprising element at least partly surrounds the light transmissive element, wherein the luminescent material comprising element comprises an element entrance part and an element escape part, wherein the element entrance part and element light escape part are radiationally coupled, and wherein the element entrance part is configured closer to the first device axis than the element escape part.

12. The arrangement according to claim 1, wherein the light transmissive element comprises a first reflective element configured to redirect first light from the first light source to the luminescent material comprising element and/or to redirect luminescent material light, wherein in an operational mode of the arrangement the first light source is configured stationary relative to the luminescent material comprising element.

13. The arrangement according to claim 12, wherein the first reflective element is configured to distribute the first light over the luminescent material comprising element, wherein the luminescent material comprising element has a ring-shaped structure, wherein the device further comprises a second optical element configured to beam shape the luminescent material light, wherein the second optical element has a half-toroidal lens or a half-toroidal reflector shape.

14. The arrangement according to claim 1, wherein the light transmissive element has a thermal conductivity of at least 10 W/m/K, and wherein the device further comprises the thermally conductive element, wherein the thermally conductive element is in thermal contact with the light transmissive element.

15. A luminaire or spotlight comprising the arrangement according to claim 1, wherein the arrangement comprises the first light source.

* * * * *